US012628686B2

(12) United States Patent
    Spreitzer et al.

(10) Patent No.: US 12,628,686 B2
(45) Date of Patent: May 12, 2026

(54) TECHNIQUES TO ENABLE A FLIP CHIP UNDERFILL EXCLUSION ZONE

(71) Applicant: Intel Corporation, Santa Clara, CA (US)

(72) Inventors: Ronald Spreitzer, Phoenix, AZ (US); Jason Garcia, Scottsdale, AZ (US); Ankur Agrawal, Chandler, AZ (US); Eleanor Patricia Paras Rabadam, Folsom, CA (US); Guiyun Bai, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 17/561,432

(22) Filed: Dec. 23, 2021

(65) Prior Publication Data
    US 2023/0207412 A1     Jun. 29, 2023

(51) Int. Cl.
| | |
|---|---|
| *H01L 23/31* | (2006.01) |
| *B81B 7/00* | (2006.01) |
| *B81C 1/00* | (2006.01) |
| *H01L 21/48* | (2006.01) |
| *H01L 21/56* | (2006.01) |
| *H01L 23/00* | (2006.01) |
| *H01S 5/0234* | (2021.01) |
| *H01S 5/50* | (2006.01) |

(52) U.S. Cl.
    CPC .......... *H01L 23/3157* (2013.01); *B81B 7/007* (2013.01); *B81C 1/00301* (2013.01); *H01L 21/4853* (2013.01); *H01L 21/563* (2013.01);

*H01L 24/16* (2013.01); *B81B 2207/07* (2013.01); *H01L 2224/16227* (2013.01); *H01L 2924/146* (2013.01); *H01L 2924/1461* (2013.01); *H01L 2924/18161* (2013.01); *H01S 5/0234* (2021.01); *H01S 5/50* (2013.01)

(58) Field of Classification Search
    CPC .......................... H01L 23/3157; H01L 21/563
    See application file for complete search history.

(56)                References Cited

U.S. PATENT DOCUMENTS

| | | | | |
|---|---|---|---|---|
| 5,591,034 | A * | 1/1997 | Ameen | ............... H01L 23/3737 |
| | | | | 29/829 |
| 6,144,091 | A | 11/2000 | Washida | |
| 6,846,725 | B2 | 1/2005 | Nagarajan et al. | |
| 6,861,740 | B2 | 3/2005 | Hsu | |
| 7,262,509 | B2 | 8/2007 | Garcia | |
| 11,320,588 | B1 * | 5/2022 | Mazed | ................... G06N 10/40 |
| 2002/0084532 | A1 | 7/2002 | Neogi et al. | |
| 2005/0253207 | A1 * | 11/2005 | Garcia | .................. H01L 23/433 |
| | | | | 257/E23.125 |
| 2008/0073768 | A1 * | 3/2008 | Shiraishi | ................. B81B 7/007 |
| | | | | 257/684 |
| 2009/0243092 | A1 * | 10/2009 | Nishimura | .......... H01L 25/0657 |
| | | | | 257/737 |
| 2017/0081175 | A1 * | 3/2017 | Steiert | ................. B81C 1/00301 |

* cited by examiner

*Primary Examiner* — Lawrence C Tynes, Jr.

(74) *Attorney, Agent, or Firm* — Compass IP Law PC

(57)                ABSTRACT

Example techniques to enable a flip chip underfill exclusion zone include use of bump barriers, films or etched substrate cavities to prevent underfill from reaching the flip chip underfill exclusion zone.

22 Claims, 20 Drawing Sheets

Flow 400

Flow 600

Flow 800

Flow 1000

Flow 1200

Flow 1400

TECHNIQUES TO ENABLE A FLIP CHIP UNDERFILL EXCLUSION ZONE

TECHNICAL FIELD

Examples described herein are generally related to techniques to enable a flip chip underfill exclusion zone for silicon-based packaging.

BACKGROUND

System on a chip (SoC) that includes one or more silicon photonics components used in such applications as light detection and ranging (LiDAR) or silicon-based microelectromechanical systems (MEMS) may have relative larger die size to accommodate these types of devices as compared to other types of SoCs (e.g., central processing unit SoCs). A larger die size may increase a need to utilize flip chip technologies to enable an SoC to have more components and yet attempt to reduce die size increases to accommodate more components.

DETAILED DESCRIPTION

As contemplated by this disclosure, a large die size associated with an SoC that includes one or more silicon photonics components or MEMs increases a need to use a flip chip side on the SoC to enable additional components to be added while minimizing increases in die size. A current generation of LiDAR sensor architectures have limitations with respect to subsequent generation product requirements. Enabling flip chip packaging for these subsequent generation products will help to mitigate various issues related to SoCs having large die sizes. For example, large/un-optimized die size, high optical loss (correlated with die size), low die yield/high die cost (correlated with die size), long manufacturing flow/process duration, higher manufacturing costs (correlated with flow complexity) and signal integrity degradation.

Various attempts to enable flip chip packaging include a use of substrate based dams/trenches to restrict underfill flow outside of a flip chip area, die based plated bar structures to also restrict underfill, or a complete underfilling between a die and a carrier substrate. The use of dams/trenches has limitations such as barrier structures are typically wide and require corresponding large exclusion zones on the die that may result in unacceptably increasing die size and die cost. The use of plated bar structures may also have limitations such as geometry/surface area/electrical resistance of a given bar barrier structure on a die is likely to be different than solder balls or bumps of the die that are formed during a same process step. This difference results in different growth rates and heights between bumps on the die and the given bar barrier structure. The different growth rates and heights can result in the given barrier structure becoming a standoff which prevents other bumps on the die from being able to electrically connect to a carrier substrate. In some cases, plating rates for bumps vs. bar structures may be significant enough to require bumps and bar structures to be formed in 2 separate electro plating processes that would result in additional processing steps/costs. Complete underfilling also has significant limitations to enable flip chip packaging. Silicon photonics have a performance and reliability risk when localized stresses are present in sensitive optical active/pool regions on flip chip side of an SoC die. Complete underfill coverage results in an epoxy included in the underfill material to bond to the SoC die in the sensitive optical active/pool regions. A resulting stress transfer to the sensitive optical active/pool regions during temperature cycling due to this epoxy bonding may unacceptably impact a silicon photonics component's performance and reliability. It is with respect to these challenges that the examples described herein are needed.

Figure 1:
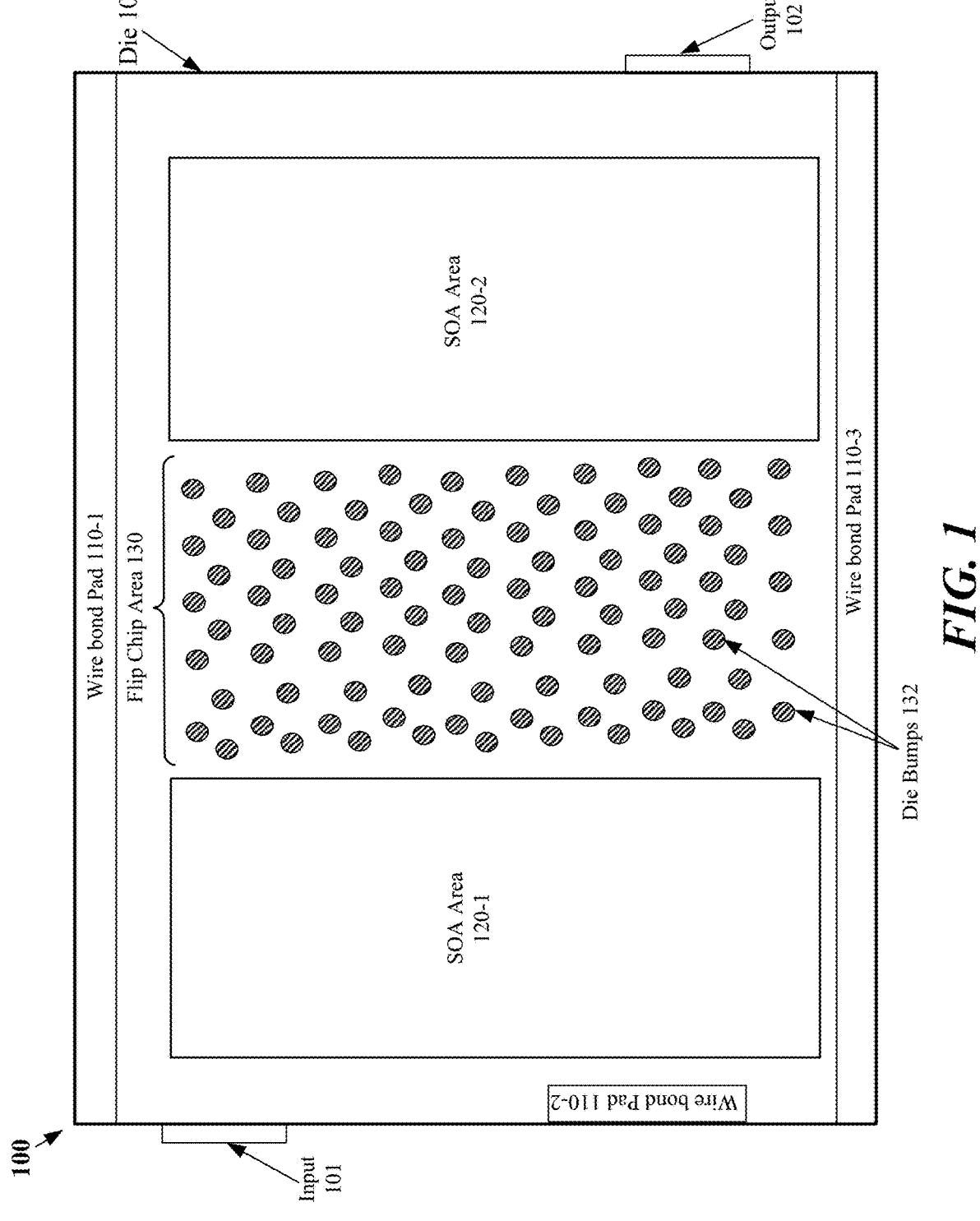
FIG. 1 illustrates a bottom view of a first example microelectronic assembly.

FIG. 1 illustrates an example bottom view of a microelectronic assembly 100. In some examples, as shown in FIG. 1, the bottom view of microelectronic assembly 100 includes an input 101, an output 102, wire bond pads 110-1 to 110-3, semiconductor optical amplifier (SOA) areas 120-1 to 120-2 and a flip chip area 130. For these examples, microelectronic assembly 100 may be configured to serve as a LiDAR silicon photonics SoC that may include additional types of silicon photonics components (not shown) and this disclosure is not limited to SOAs as the only source of stress sensitive exclusion zones on a bottom or flip chip side of the LiDAR silicon photonics SoC, other types of active silicon photonics components (e.g., lasers, photo detectors, etc.) are contemplated.

According to some examples, input 101 may be configured to receive optical inputs for a LiDAR silicon photonics SoC that includes microelectronic assembly 100 and output 102 that may be configured to transmit optical output signals. Wire bond pads 110-1 to 110-3 may facilitate an interconnection with a carrier substrate (not shown) that may occur during a manufacturing of the LiDAR silicon photonics SoC.

As shown in FIG. 1, in some examples, a bottom side of die 105 includes a flip chip area 130. For these examples, flip chip area 130 includes a plurality of die bumps 132. Die bumps 132 may be arranged, for example, to enable a silicon photonics component such as SOA 120-1 or 120-2 to electrically couple with a trans-impedance amplifier (TIA) via a carrier substrate, the TIA and carrier substrate are not shown in FIG. 1. Allowing a TIA to be flip chip mounted to a carrier substrate vs. flip chip mounted directly on a silicon photonics die such as die 105 helps to reduce a die size of die 105 and may eliminate at least some space required for bond pads and trace routing to bond pads. Also, a reduced die size for die 105 translates to a reduction in optical routing from input 101 to output 102. Reduced optical loss may result in improvements in an overall link power budget and in output power.

In some examples, improvements to signal integrity may also result for a flip chip mounted TIA on a carrier substrate compared to a flip chip TIA directly mounted on a silicon photonics die such as die 105. For example, traces to route signals from a stacked/bonded TIA to wire bond pads may typically be limited to 2 metal layers in a silicon photonics die such as die 105. A full flip chip vs. a hybrid stacked and wire bonded solution allows for routing to primarily be done in a carrier substrate. Carrier substrates typically have more than 2 metal layers to provide better isolation between power ground and signal layers.

According to some examples, reductions in assembly process complexity may also result for a flip chip mounted TIA on a carrier substrate. For example, first generation LiDAR silicon photonics SoCs or packages utilize chip on wafer bonding for TIAs. This chip wafter bonding adds multiple processes to an assembly process flow which negatively impacts manufacturing cost and throughput. Also, die bumps 132 may be arranged as electro plated bump barrier structures to further minimize manufacturing cost/ assembly process complexity as electro plated bump barrier structures may be formed at a same time as forming electrical interconnects.

Although example microelectronic assembly is described for use in a LiDAR silicon photonics SoC, other example applications may include other types of co-packaged switch products and optical transceivers. Also, other example applications may include SoCs with flip chip capabilities that include MEMS devices which may have sensitive and/or moving structures on a flip chip side of an SoC.

In some examples, a key risk for use of flip chip packaging has been due to a resulting elevated stress in a region where Indium-Phosphide has been bonded to enable active silicon photonic devices included in SOA areas 120-1 or 120-2. For these examples, Indium-Phosphide bonding and active silicon photonic devices included in SOA areas 120-1 or 120-2 are not shown in FIG. 1. Stress from a type of underfill such as an epoxy polymer underfill applied to die 105 is a key risk, as increased stresses in the region directly below SOA areas 120-1 or 120-2 where Indium-Phosphide bonding has occurred may impact performance and/or reliability of these active silicon photonics components or devices. As described more below, various example methods to prevent underfill such as an epoxy underfill from bonding to a die in stress sensitive regions are disclosed. Examples are not limited to elevated stress regions due to Indium-Phosphide bonding, other types of silicon photonics components such as lasers or photo detectors may have elevated stress regions that may be negatively impacted by underfill epoxy reaching these elevated stress regions.

Figure 2:
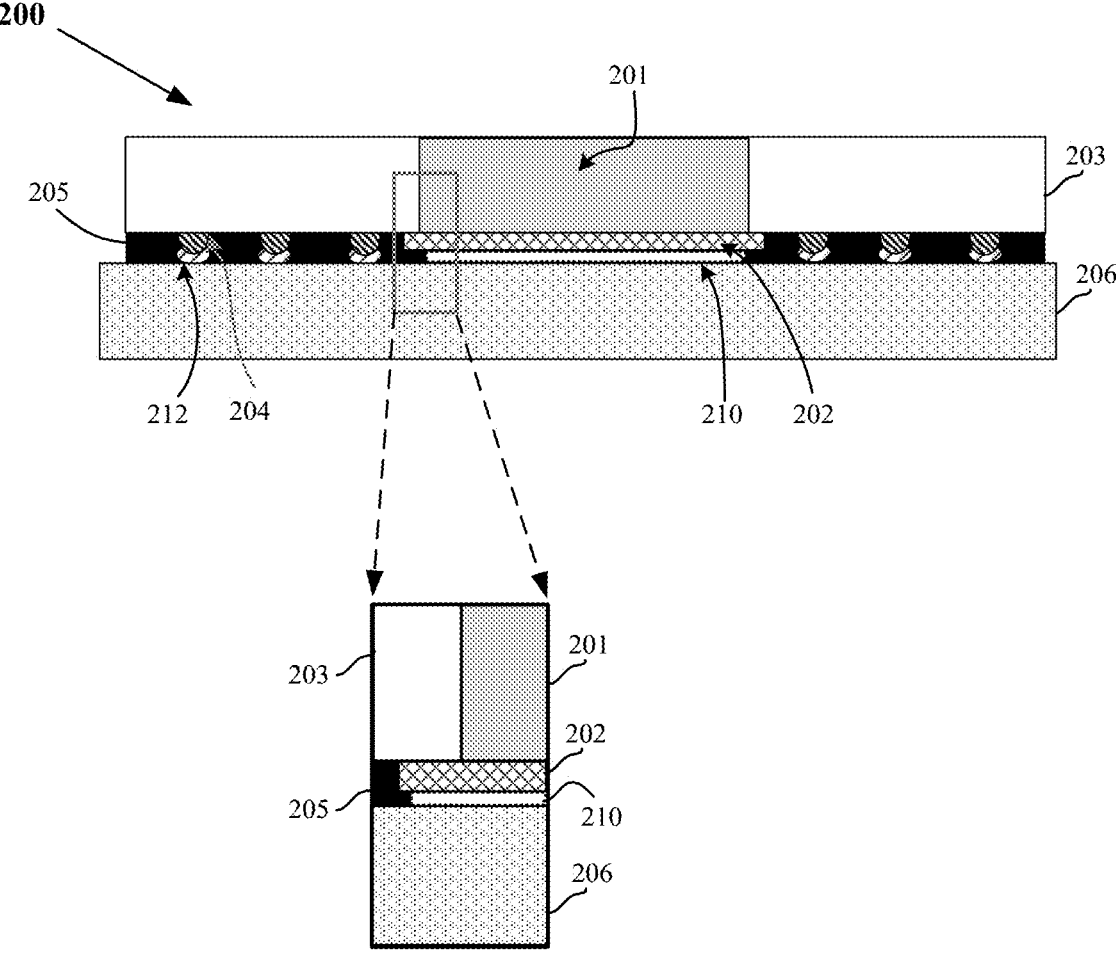
FIG. 2 illustrates a cross-sectional and expanded cross-sectional view of a second example microelectronic assembly.

FIG. 2 illustrates a cross-sectional view of a microelectronic assembly 200 with an expanded cross-sectional view. In some examples, as shown in FIG. 2, microelectronic assembly 200 includes a die substrate 203 having a shaded keep out zone 201. For these examples, keep out zone 201 may represent a silicon photonics components included in SOA areas 120 being bonded to die 105 (e.g., via Indium-Phosphide bonding). Also, as mentioned above for SOA areas 120, the area below keep out zone 201 may be subject to elevated stresses for a flip chip configuration. Microelectronic assembly 200, in some examples, may be in a flip chip configuration via a coupling of die bumps 204 with respective conductive lands 212 located on a carrier substrate 206. In some examples, microelectronic assembly 200 may be placed in a reflow oven, which heats die bumps 204 to cause die bumps 204 to melt and join with conductive lands 212. The coupling of die bumps with respective conductive lands 212 may be to electrically connect to metal lines (not shown) formed in carrier substrate 206 to route signals transmitted through die bumps 204 (e.g., transmitted from a LIDAR silicon photonics SoC to a TIA).

FIG. 2 illustrates a cross-sectional view of a microelectronic assembly 200 with an expanded cross-sectional view. In some examples, as shown in FIG. 2, microelectronic assembly 200 includes a die substrate 203 having a shaded keep out zone 201. For these examples, keep out zone 201 may represent a silicon photonics components bonded to die substrate 203 in a similar manner as mentioned above for SOA 120 being bonded to die 105 (e.g., via Indium-Phosphide bonding). Also, as mentioned above for SOA 120, the area below keep out zone 201 may be subject to elevated stresses for a flip chip configuration. Microelectronic assembly 200, in some examples, may be in a flip chip configuration via a coupling of die bumps 204 with respective conductive lands 212 located on a carrier substrate 206. In some examples, microelectronic assembly 200 may be placed in a reflow oven, which heats die bumps 204 to cause die bumps 204 to melt and join with conductive lands 212. The coupling of die bumps with respective conductive lands 212 may be to electrically connect to metal lines (not shown) formed in carrier substrate 206 to route signals transmitted through die bumps 204 (e.g., transmitted from a LIDAR silicon photonics SoC to a TIA).

According to some examples, an epoxy underfill 205 may be used during assembly of microelectronic assembly 200 to protect die bumps 204 and to improve the solder joint reliability of die bumps 204 by reducing the solder joint stress induced by CTE (Coefficient of Thermal Expansion) mis-match between the silicon die substrate 203 and the organic carrier substrate 206. Examples are not limited to epoxy underfills, other underfills may include, but are not limited to, urethane underfills. In order to prevent epoxy underfill 205 from flowing to a stress sensitive area below keep out zone 201 during assembly of microelectronic assembly 200, a film barrier shown in FIG. 2 as sacrificial/ low stress layer 202 is deposited on die substrate 203 below keep out zone 201. A thickness of sacrificial/low stress layer 202 should be of a height to restrict the flowing of epoxy underfill 205 to the stress sensitive area below keep out zone 201. Some bleedout of epoxy material included in epoxy underfill 205 may occur but should be limited to the outer edges of sacrificial/low stress layer 202 such that an inner region air gap exists that includes no epoxy underfill 205. For example, as shown in FIG. 2, an air gap 210 is located between sacrificial/low stress layer 202 and an upper surface of carrier substrate 206 and a relatively small amount of epoxy underfill 205 is shown below sacrificial/low stress layer 202. Air gap 210 allows for some flexibility such that a height or thickness of sacrificial/low stress layer 202 is not too thick/high to prevent a seating of die bumps 204 with conductive lands 212 when microelectronic assembly 200 is assembled.

In some examples, use of a lithographic film is one example for a deposited film barrier to use for sacrificial/low stress layer 202. Multiple lithographic film layers may need to be dispensed during the depositing of the film barrier to achieve a net film thickness/height to restrict the flowing of epoxy underfill 205 to the stress sensitive area below keep out zone 201. Other materials such as, but not limited to, oxides and dielectrics commonly used for semiconductors may also be used as a deposited film barrier to use for sacrificial/low stress layer 202. A net thickness/height of sacrificial/low stress layer 202 varies based on factors to include a size or amount of epoxy underfill 205 used or a viscosity of a polymer included in epoxy underfill 205. For example, a lower viscosity for epoxy underfill 205 may require a larger thickness/height for the deposited film barrier compared to a higher viscosity as the lower viscosity has a greater potential to bleedout to the stress sensitive area below keep out zone 201.

Figure 3A:
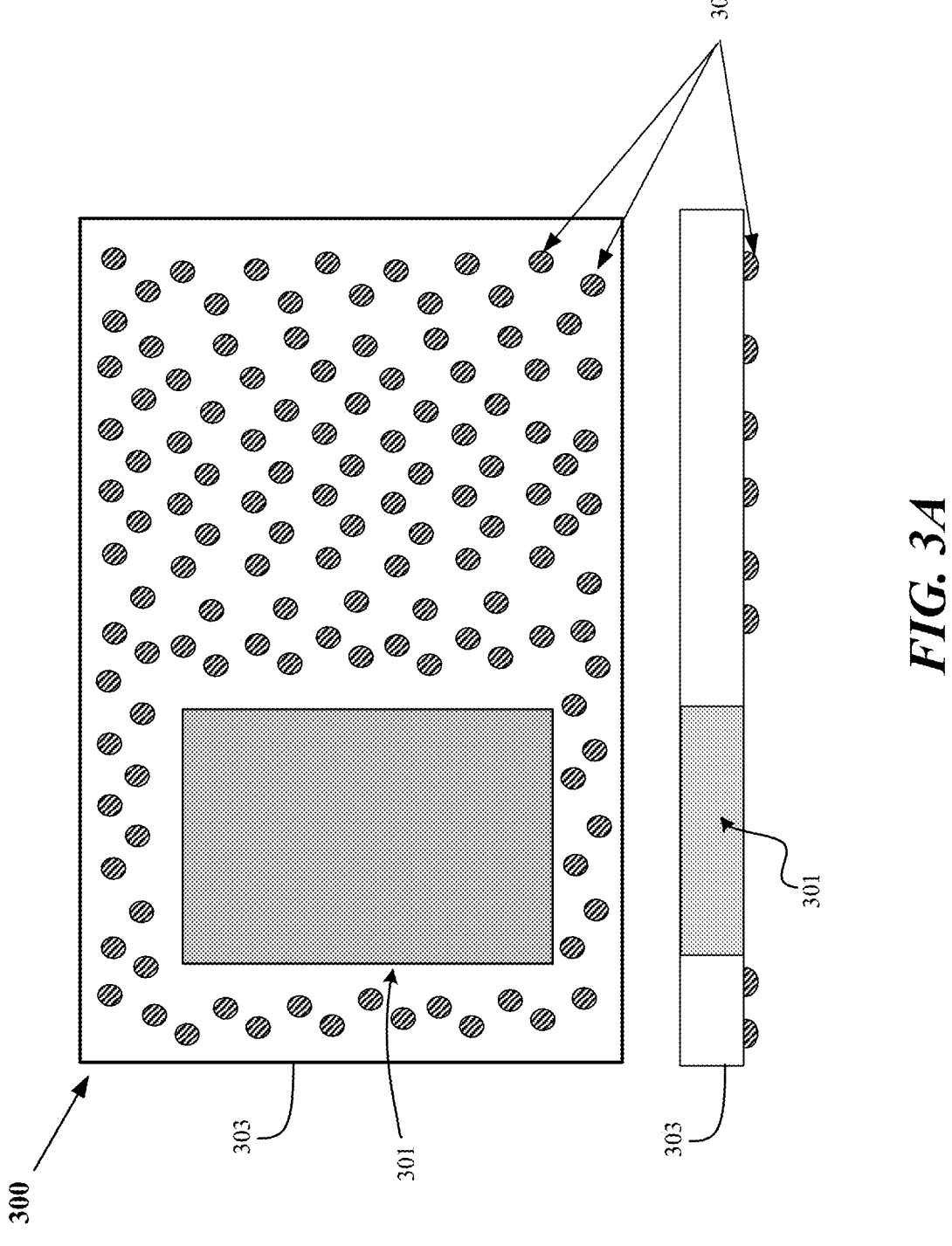
FIGS. 3A-C illustrate bottom and cross-sectional views of a third example microelectronic assembly.
Figure 3B:
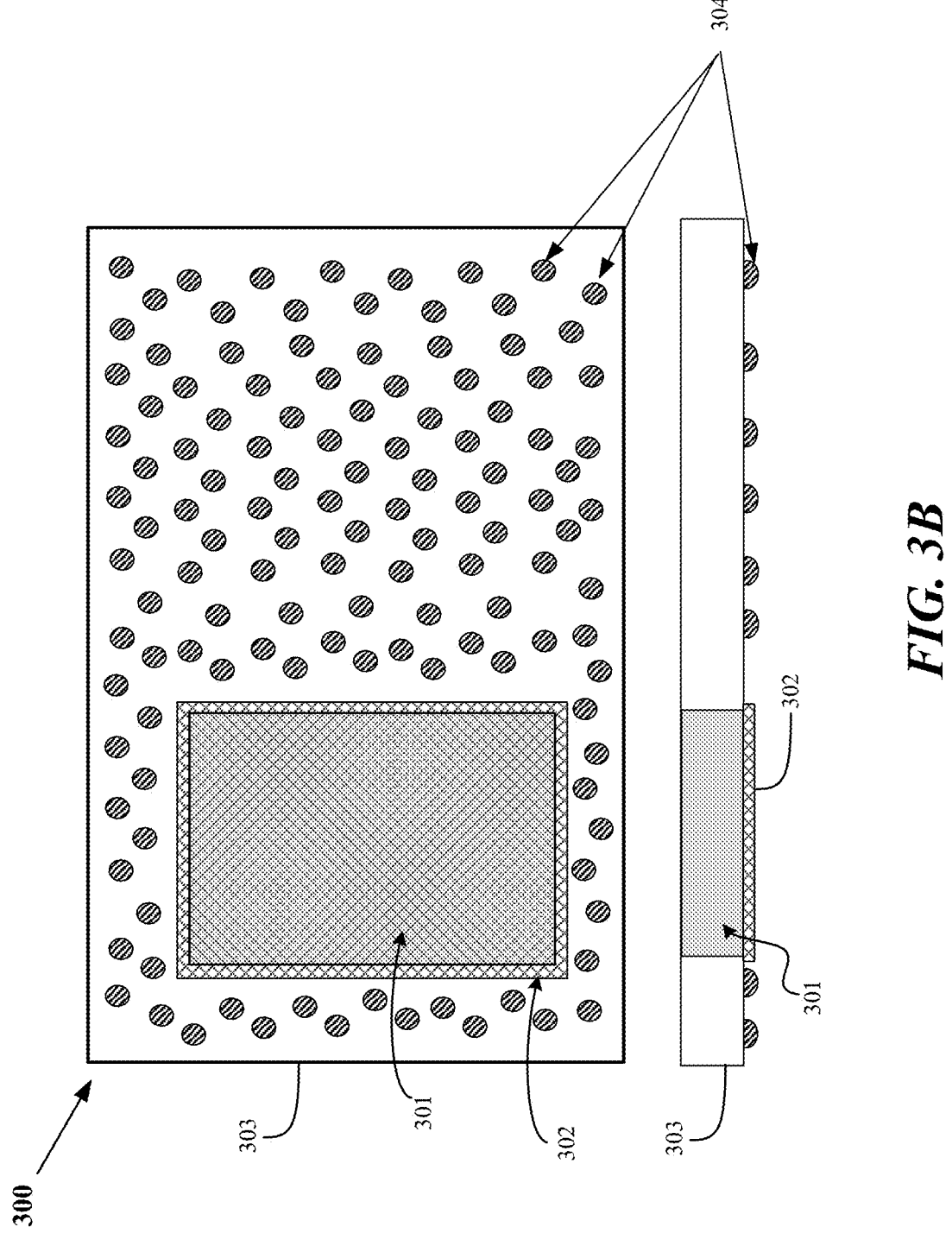
Figure 3C:
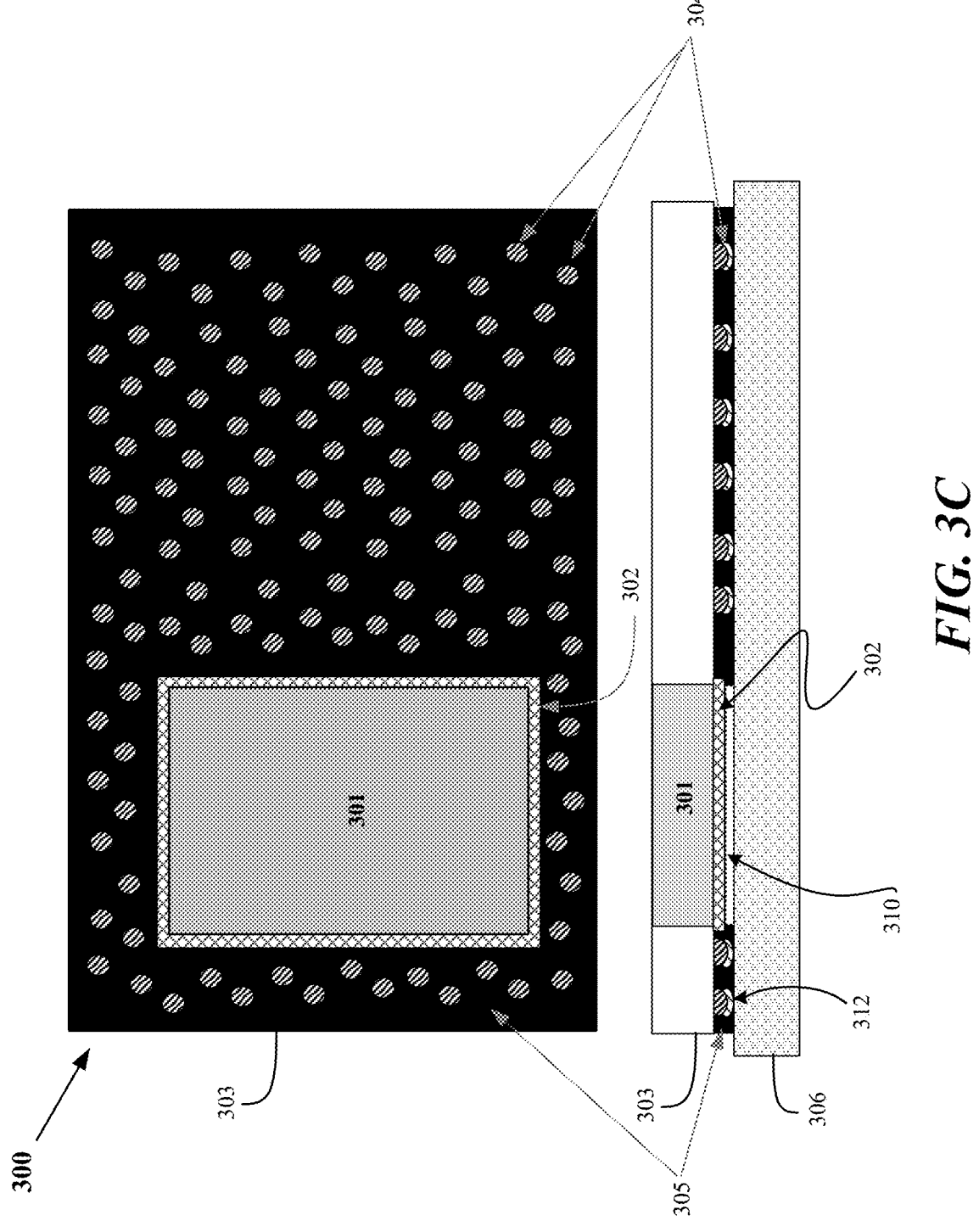

FIG. 3A-C illustrates bottom and cross-sectional views of a microelectronic assembly 300. In some examples, as shown in FIG. 3A, a bottom view of a die substrate 303 for microelectronic assembly 300 includes a shaded keep out zone 301. For these examples, keep out zone 301 may be an area directly below an active silicon photonic device such as SOA 120-1 or 120-2 mentioned above for FIG. 1. The shaded area of keep out zone 301 may, for example, be where Indium-Phosphide has been bonded to enable an active silicon photonics component or device. Die substrate 303 is also shown in FIG. 3A as including die bumps 304 distributed over the bottom surface of die substrate 303, except for keep out zone 301, to enable a flip chip configuration (e.g., for a silicon photonics die that may include die substrate 303). For these examples, a cross-sectional view of die substrate 303 depicts a view without a deposited film barrier placed below keep out zone 301.

According to some examples, as shown in FIG. 3B, a sacrificial/low stress layer 302 is shown as being placed over keep out zone 301. For these examples, a cross-section view of die substrate 303 shows a relative thickness of sacrificial/low stress layer 302 as being approximately equal to a height of die bumps 304. The sacrificial/low stress layer 302 may be a deposited film barrier that was deposited using multiple lithographic film layers to achieve the relative thickness shown in FIG. 3B.

In some examples, as shown in FIG. 3C, a solid black epoxy underfill 305 is added to carrier substrate 306 to improve the solder joint reliability of die bumps 304 between silicon die substrate 303 and organic carrier substrate 306 and to protect die bumps 304. For these examples, as shown in FIG. 3C, an air gap 310 located directly below sacrificial/low stress layer 302 remains following the addition of epoxy underfill 305. A relatively small amount of epoxy underfill 305 is shown as flowing under sacrificial/low stress layer 302. Relative thickness/heights of sacrificial/low stress layer 302 may depend on a viscosity of the epoxy underfill 305. For example, a thicker sacrificial/low stress layer 302 may be needed for a low viscosity epoxy underfill 305.

In some examples, as shown in FIG. 3C, die bumps 304 may be coupled with respective conductive lands 312. For these examples, microelectronic assembly 300 may be placed in a reflow oven, which heats die bumps 304 to cause die bumps 304 to melt and join with conductive lands 312.

Figure 4:
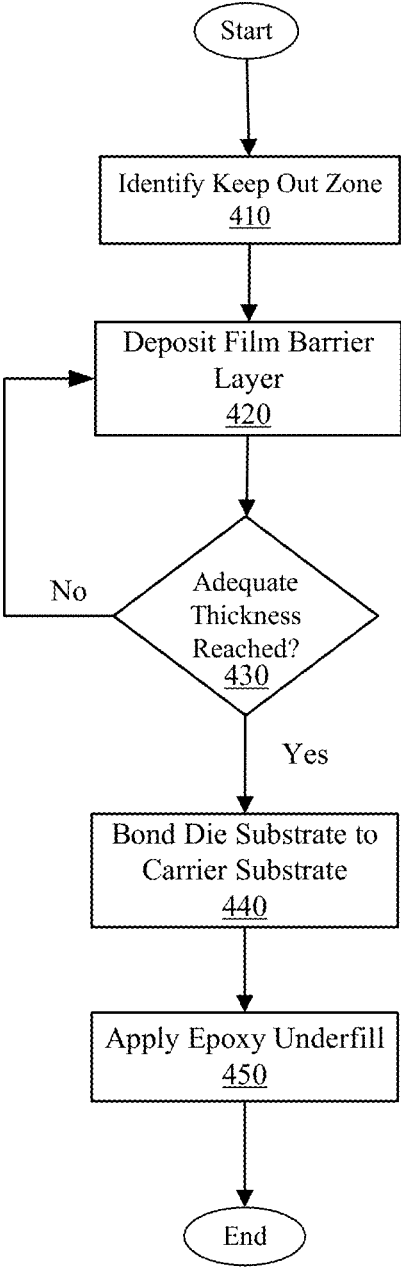
FIG. 4 illustrates an example first process flow.

FIG. 4 illustrates an example process flow 400. In some examples, process flow 400 shows a process flow to at least partially assemble microelectronic assembly 300 as shown in FIGS. 3A-C and described above.

Starting at block 410, process flow 400 identifies a keep out zone. In some examples, as mentioned above for FIG. 3A, keep out zone 301 of die substrate 303 may be identified as an area directly below an active silicon photonics component or device.

Moving from block 410 to block 420, process flow 400 deposits a film barrier layer over the keep out zone. According to some examples, sacrificial/low stress layer 302 may be deposited over keep out zone 301.

Moving from block 420 to decision block 430, process flow 400 determines whether an adequate thickness has been reached for the deposited film barrier layer. In some examples, an adequate thickness may be based on whether epoxy underfill 305 has a low or high viscosity and/or an amount of epoxy underfill material expected to be used for epoxy underfill 305 to improve solder joint reliability of die bumps 304 between a silicon die substrate 303 and an organic carrier substrate 306. If the deposited film barrier has reached an adequate thickness, process flow moves to block 440. Otherwise, process flow moves back to block 420 to deposit an additional film barrier layer.

Moving from decision block 430 to block 440, process flow 400 bonds die substrate to carrier substrate. In some examples, bonding of die substrate 303 to carrier substrate 306 may include placing microelectronic assembly 300 in a reflow oven to cause die bumps 304 to melt and join with conductive lands 312.

Moving from decision block 440 to block 450, process flow 400 applies an epoxy underfill to a carrier substrate. According to some examples, epoxy underfill 305 is applied to carrier substrate 306. Process flow 400 may then come to an end.

Figure 5A:
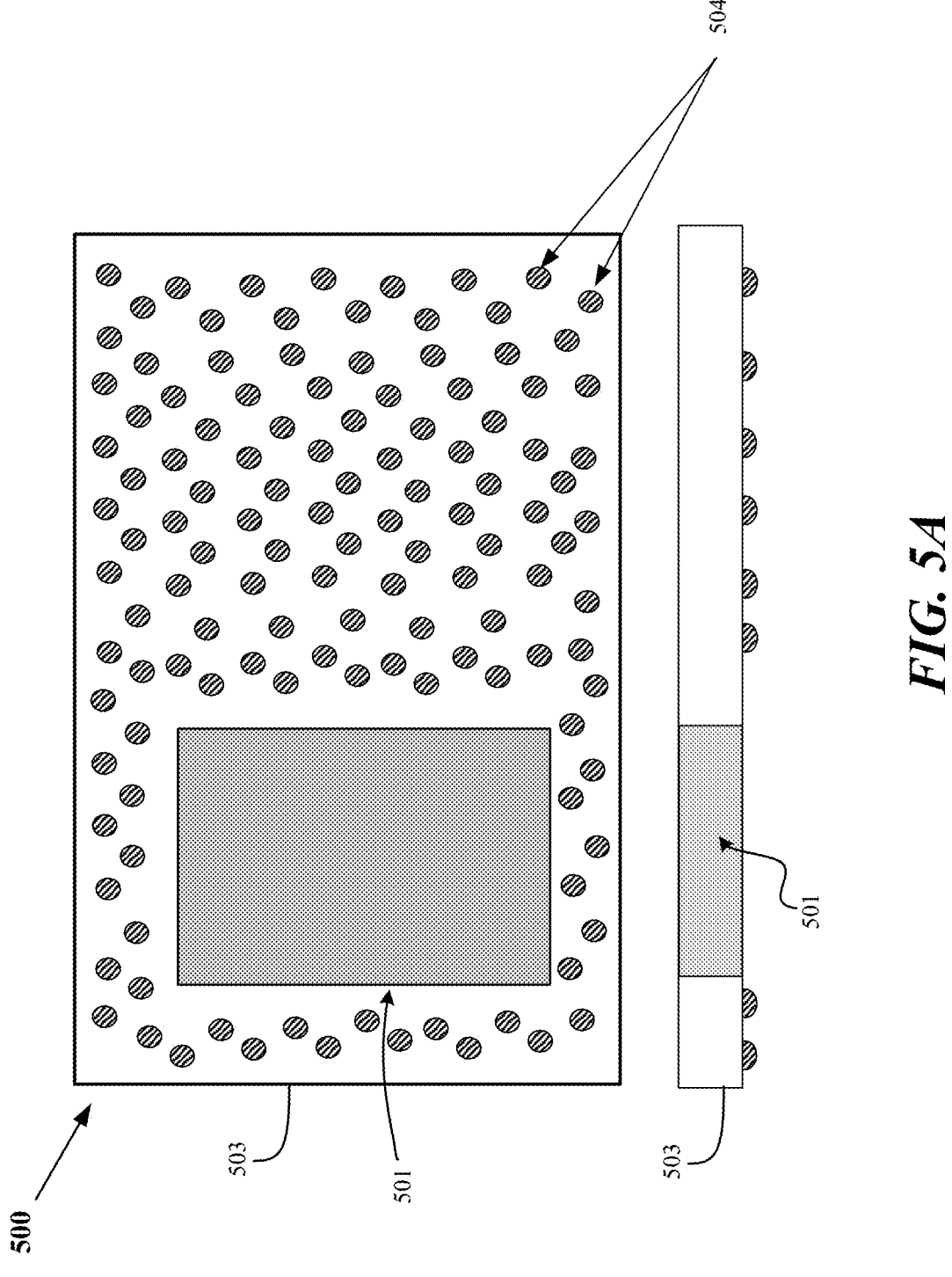
FIGS. 5A-C illustrate bottom and cross-sectional views of a fourth example microelectronic assembly.
Figure 5B:
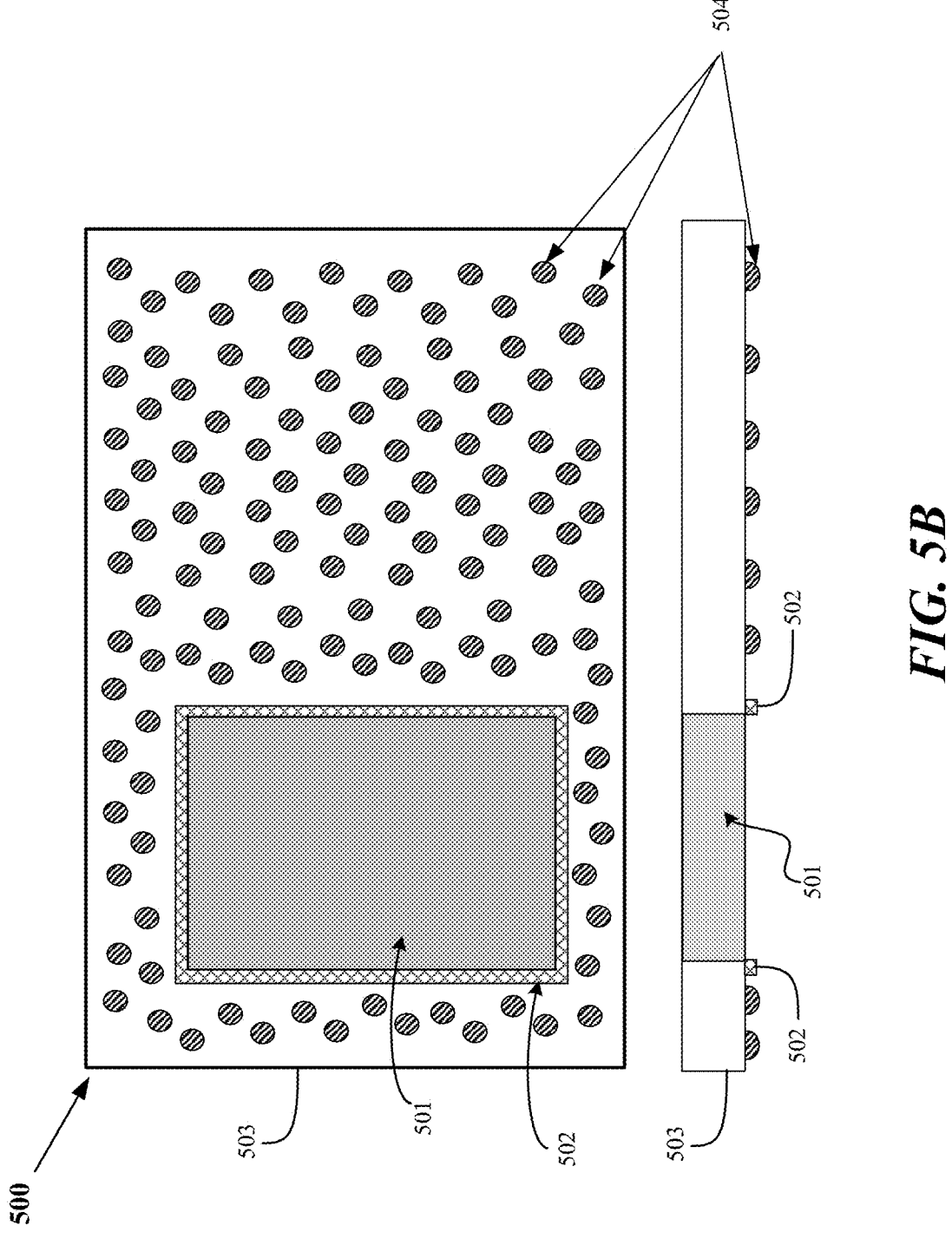
Figure 5C:
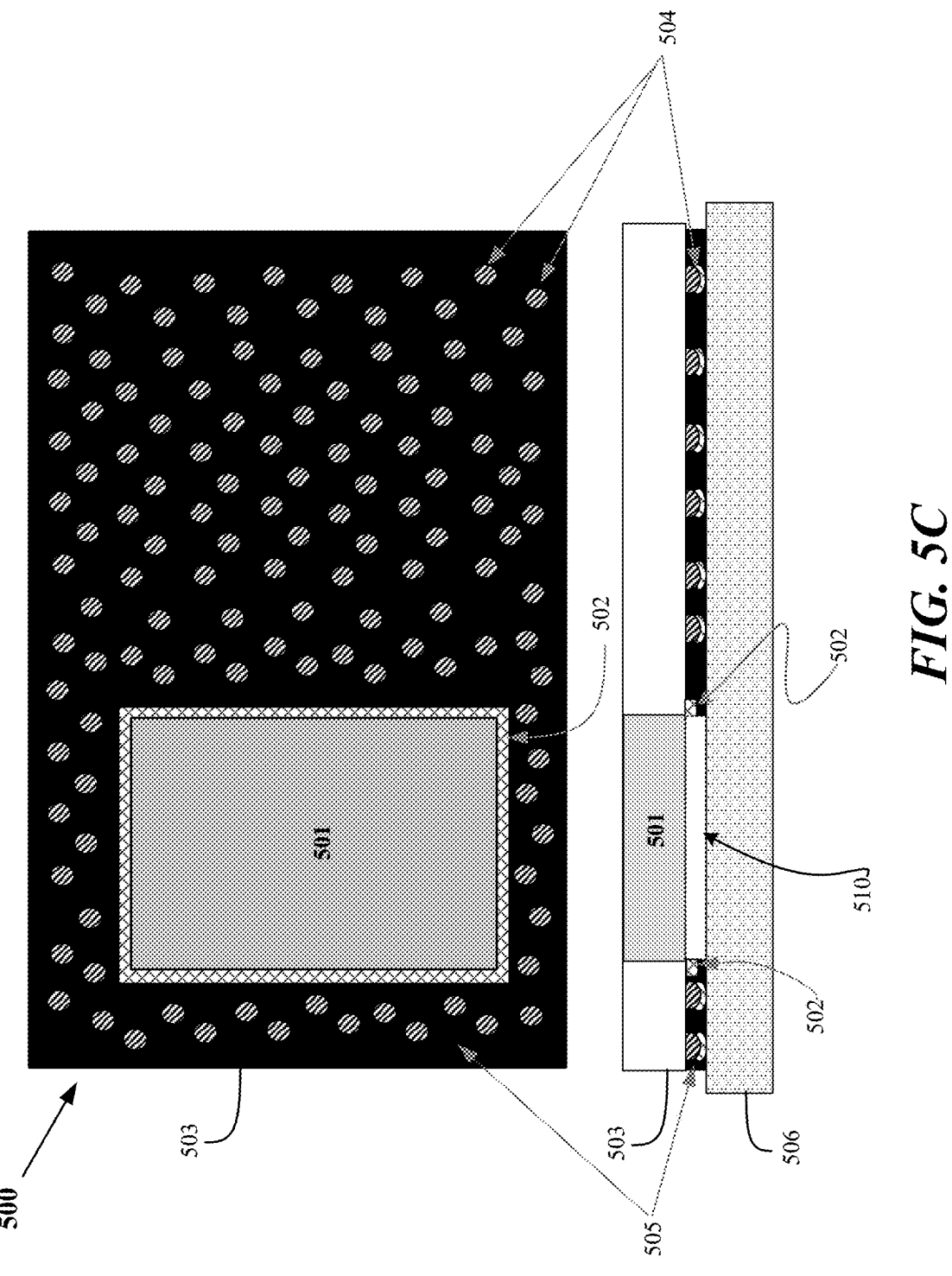

FIG. 5A-C illustrates bottom and cross-sectional views of a microelectronic assembly 500. In some examples, as shown in FIG. 5A, a bottom view of a die substrate 503 for microelectronic assembly 500 includes a shaded keep out zone 501. For these examples, similar to shaded keep out zone 301, shaded keep out zone 501 may be an area directly below an active silicon photonics component or device. Die substrate 503 is also shown in FIG. 5A as including die bumps 504 distributed over the bottom surface of die substrate 503, except for keep out zone 501, to enable a flip chip configuration (e.g., for a silicon photonics die that may include die substrate 503). For these examples, a cross-sectional view of die substrate 503 depicts a view without a deposited film barrier placed below keep out zone 501.

According to some examples, as shown in FIG. 5B, a sacrificial/low stress wall 502 is shown as being placed around keep out zone 501. For these examples, a cross-section view of die substrate 503 shows a relative thickness of sacrificial/low stress wall 502 as being approximately equal to a height of die bumps 50. The sacrificial/low stress wall 502 may be a deposited film barrier wall that was deposited using multiple lithographic film layers to achieve the relative thickness of the film barrier wall as shown in FIG. 5B.

In some examples, as shown in FIG. 5C, a solid black epoxy underfill 505 is added to die substrate 503 to improve the solder joint reliability of die bumps 504 between die substrate 503 and carrier substrate 506 and to protect die bumps 50. For these examples, as shown in FIG. 5C, an air gap 510 located directly below sacrificial/low stress wall 502 remains following the addition of epoxy underfill 505. A relatively small amount of epoxy underfill 505 is shown as flowing under sacrificial/low stress wall 502, but no epoxy underfill 505 is allowed to flow under keep out zone 501. A width of sacrificial/low stress wall 502 may depend on a viscosity of the epoxy underfill 505. For example, a wider sacrificial/low stress wall 502 may be needed for a low viscosity epoxy underfill 505 than would be needed for a higher viscosity epoxy underfill 505.

In some examples, as shown in FIG. 5C, die bumps 504 may be coupled with respective conductive lands 512. For these examples, microelectronic assembly 500 be placed in a reflow oven, which heats die bumps 504 to cause die bumps 504 to melt and join with conductive lands 512.

Figure 6:
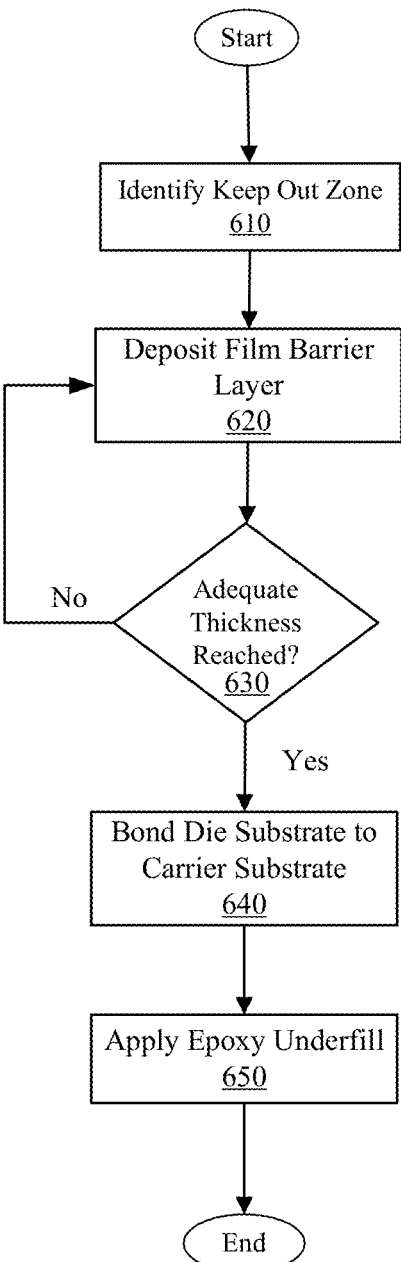
FIG. 6 illustrates an example second process flow.

FIG. 6 illustrates an example process flow 600. In some examples, process flow 600 shows a process flow to at least partially assemble microelectronic assembly 500 as shown in FIGS. 5A-C and described above.

Starting at block 610, process flow 600 identifies a keep out zone. In some examples, as mentioned above for FIG. 5A, keep out zone 501 of die substrate 503 may be identified as an area directly below an active silicon photonics component or device.

Moving from block 610 to block 620, process flow 600 deposits a film barrier wall around the keep out zone. According to some examples, sacrificial/low stress wall 502 may be deposited around keep out zone 501.

Moving from block 620 to decision block 630, process flow 600 determines whether an adequate thickness has been reached for the deposited film barrier wall. In some examples, an adequate thickness of the film barrier wall may be based on whether epoxy underfill 505 has a low or high viscosity and/or an amount of epoxy underfill material expected to be used for epoxy underfill 505 to improve solder joint reliability of die bumps 504 between silicon die substrate 503 and organic carrier substrate 506. If the deposited film barrier wall has reached an adequate thickness, process flow moves to block 640. Otherwise, process flow moves back to block 620 to deposit an additional film barrier layer.

Moving from decision block 630 to block 640, process flow 600 bonds die substrate to carrier substrate. In some examples, bonding of die substrate 503 to carrier substrate 506 may include placing microelectronic assembly 500 in a reflow oven to cause die bumps 504 to melt and join with conductive lands 512.

Moving from decision block 640 to block 650, process flow 600 applies an epoxy underfill to a die substrate. According to some examples, epoxy underfill 505 is applied to carrier substrate 506. Process flow 600 may then come to an end.

Figure 7A:
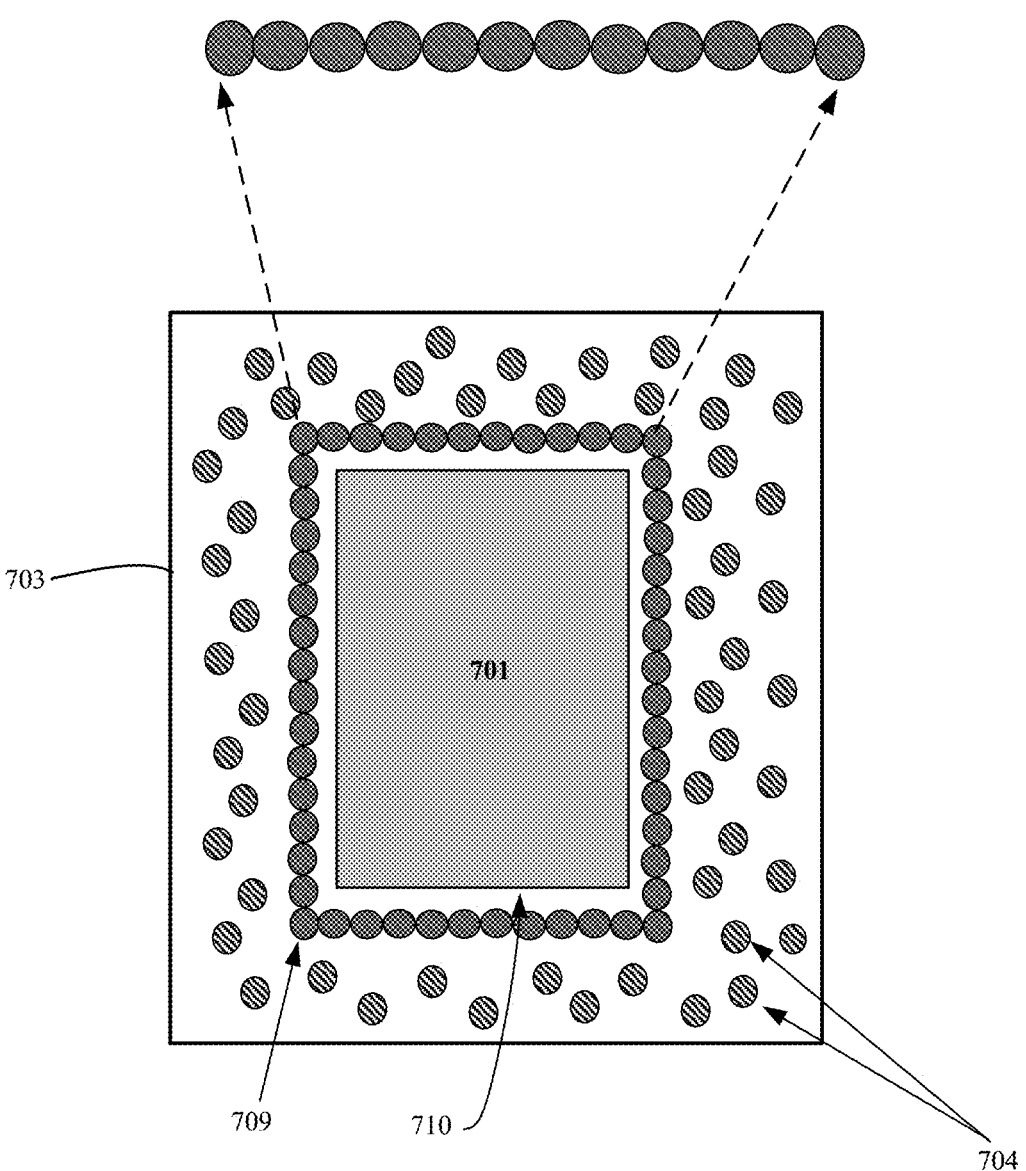
FIGS. 7A-B illustrate a bottom view of a first example substrate die of a microelectronic assembly with an expanded view of a first example bump barrier.
Figure 7B:
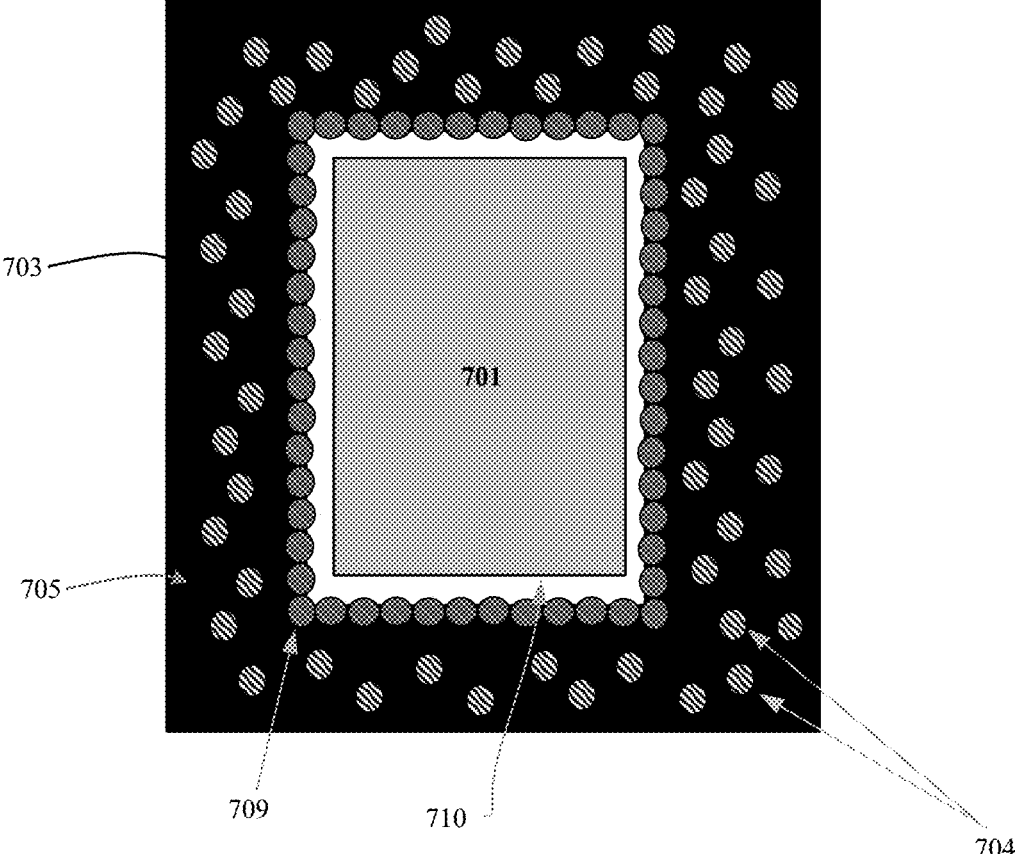

FIGS. 7A-B illustrate a bottom view of a die substrate 703 for a microelectronic assembly with an expanded view of a portion of a bump barrier 709. According to some examples, as shown in FIG. 7A, a bottom of a die substrate 703 includes a shaded keep out zone 701. For these examples, keep out zone 701, similar to keep out zones 301 and 501 described above, may be an area directly below an active silicon photonics component or device. Die substrate 703 is also shown in FIG. 7A as including die bumps 704 distributed over the bottom surface of die substrate 703.

In some examples, a dense bump barrier 709 may be placed around keep out zone 701. The expanded view of a portion of bump barrier 709 shows that the bumps are contiguously connected to create a wall or fence that is able to restrict or prevent a flow of an epoxy underfill to keep out zone 701. Bump barrier 709 may include electro plated bumps that are about a same size as die bumps 704 to ensure a consistent growth rate of the bumps included in bump barrier 709 with the bumps included in die bumps 704. However, since the bumps in bump barrier 709 are contacting each other, the growth rate may be impacted during an electro plating process to form the bumps included in both bump barrier 709 and die bumps 704. Differences in growth rates need to be considered in order for bumps included in both bump barrier 709 and die bumps 704 to have about a same final height following the electro plating process. A height that is too high may impact a coupling of die bumps 704 to respective conductive lands of a carrier substrate, a height that is too low may allow for the epoxy underfill to flow to and reach keep out zone 701.

According to some examples, as shown in FIG. 7B, a solid black epoxy underfill 705 is added to die substrate 703 to protect die bumps 704 and to improve solder joint reliability of die bumps 704 between silicon die substrate 703 and an organic carrier substrate. For these examples the white area between keep out zone 701 and bump barrier 709 shows how epoxy underfill 705 is prevented from reaching keep out zone 701.

Figure 8:
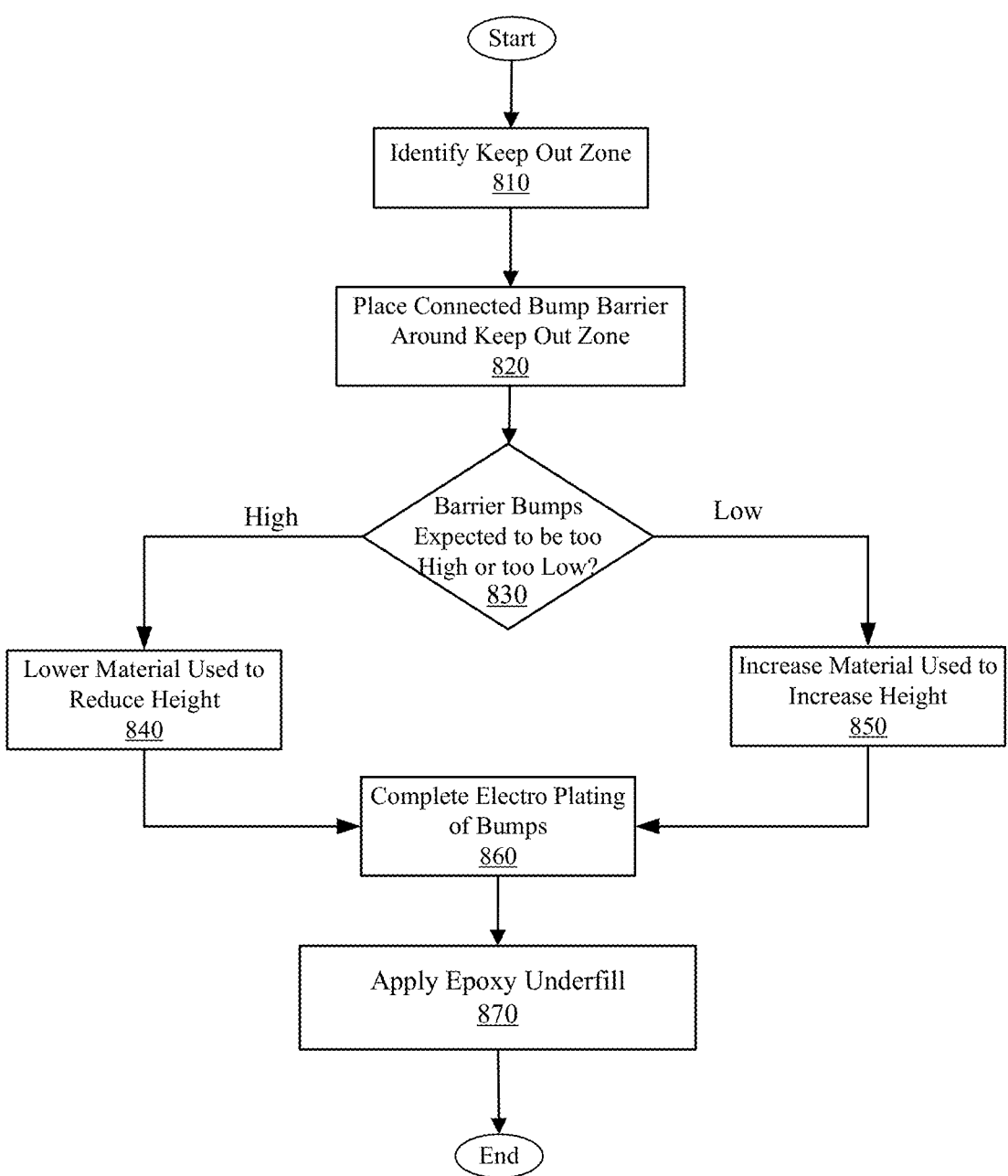
FIG. 8 illustrates an example third process flow.

FIG. 8 illustrates an example process flow 800. In some examples process flow 800 shows a process flow to at least partially assemble die substrate 703 as shown in FIGS. 7A-B and described above.

Starting at block 810, process flow 800 identifies a keep out zone. In some examples, as mentioned above for FIG. 7A, keep out zone 701 of die substrate 703 may be identified as an area directly below an active silicon photonics component or device.

Moving from block 810 to block 820, process flow 800 includes placing a connected bump barrier around the keep out zone on a bottom side of a die substrate. In some examples, bump barrier 709 is placed around keep out zone 701 on a bottom side of die substrate 703.

Moving from block 820 to decision block 830, process flow 800 includes determining whether bumps included in the bump barrier are expected to be too high or too low in relation to die bumps located on the die substrate. According to some examples, a determination is made as to whether bumps included in bump barrier 709 are expected to be too high or too low in relation to die bumps 704 due to varying growth rates during an electro plating process between bumps included in die bumps 704 and bumps included in bump barrier 709. In some examples, the material used for bumps included in die bumps 704 and bumps included in barrier bumps 709 may include, but is not limited to, a solder or copper material. For these examples, the expected growth rates may be based on use of solder or copper. If expected to be too high, process flow moves to block 840. If expected to be too low, process flow moves to block 850.

Moving from decision block 830 to block 840, process flow 800 includes lowering an amount of material used for each bump included in the bump barrier to cause a lowering of the height of the bump barrier. In some examples, an amount of material (e.g., solder or copper) included in barrier bumps 709 is lowered to cause a lowering of the height of bump barrier 709 to attempt to match expected heights of die bumps 704 following an electro plating process.

Moving from decision block 830 to block 850, process flow 800 includes increasing an amount of material used for each bump included in the bump barrier. According to some examples, increasing an amount of material used for each bump included in bump barrier 709 may cause an increase of the height of bump barrier 709 to attempt to match expected heights of die bumps 704 following an electro plating process.

Moving from either block 840 or block 850 to block 860, process flow 800 includes completing the electro plating of bumps included in the die bumps and the bump barrier. In some examples, this includes completing the electro plating of bumps included in die bumps 704 and in bump barrier 709.

Moving from block 860 to block 870, process flow 800 includes applying epoxy underfill 705 to a carrier substrate after the bumps have been reflowed and attached to the carrier substrate. Process flow 800 may then come to an end.

Figure 9A:
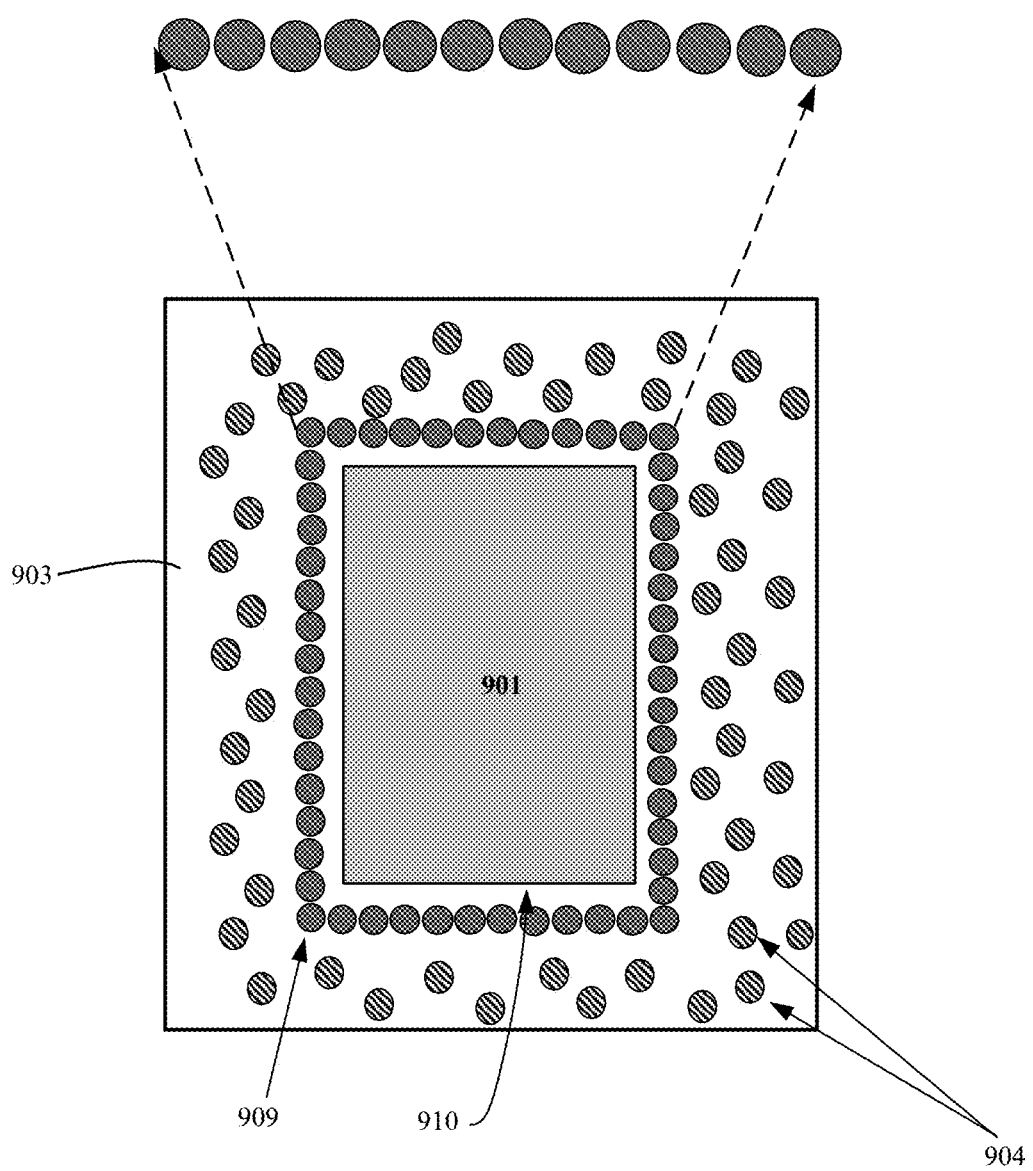
FIGS. 9A-B illustrate a bottom view of a second example substrate die of a microelectronic assembly with an expanded view of a second example bump barrier.
Figure 9B:
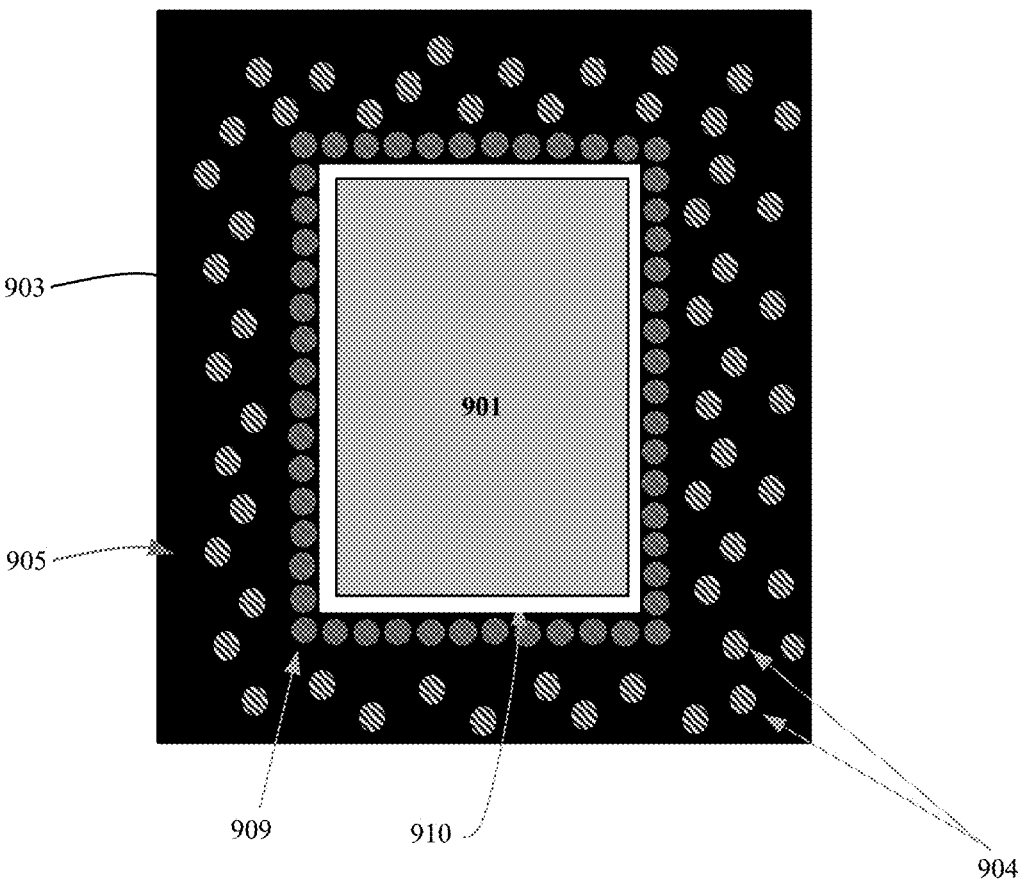

FIGS. 9A-B illustrate a bottom view of a die substrate 903 for a microelectronic assembly with an expanded view of a portion of a bump barrier 909. According to some examples, as shown in FIG. 9A, a bottom of a die substrate 903 includes a shaded keep out zone 901. For these examples, keep out zone 901, similar to keep out zones 301, 501 and 701 described above, may be an area directly below an active silicon photonics component or device. Die substrate 903 is also shown in FIG. 9A as including die bumps 904 distributed over the bottom surface of die substrate 903.

In some examples, a dense bump barrier 909 may be placed around keep out zone 901 in a similar manner as described above for bump barrier 709 shown in FIGS. 7A-B. However, expanded view of a portion of bump barrier 909 shows that the bumps are not connected to each other to create a solid wall or fence as described above for bump barrier 709. Rather bumps included in bump barrier 909 are placed closed enough together with an intent to restrict or prevent a flow of an epoxy underfill from reaching keep out zone 901. In other words, some epoxy underfill may flow past bump barrier 909, but not enough to reach keep out zone 901. Bump barrier 909 may include electro plated bumps that are about a same size as bumps included in die bumps 904. Keeping the bumps included in bump barrier 909 from contacting each other helps to ensure a consistent growth rate of these bumps with the bumps included in die bumps 904 following an electro plating process.

According to some examples, a spacing between bumps included in bump barrier 909 may be based on a viscosity of a polymer included in an epoxy underfill. A lower viscosity for the polymer may require a smaller spacing compared to a higher viscosity for the polymer in order to keep the epoxy underfill from reaching keep out zone 901. Also, the perimeter of bump barrier 909 may be increased to result in a farther distance the epoxy underfill has to flow to reach keep out zone 901.

According to some examples, as shown in FIG. 9B, a solid black epoxy underfill 905 is added to die substrate 903 to protect die bumps 904 to improve solder joint reliability of bumps 904 between silicon die substrate 903 and an organic carrier substrate. For these examples the white area between keep out zone 901 and bump barrier 909 shows that although some epoxy underfill 905 has flowed past bump barrier 909, epoxy underfill 905 does not reach keep out zone 901.

Figure 10:
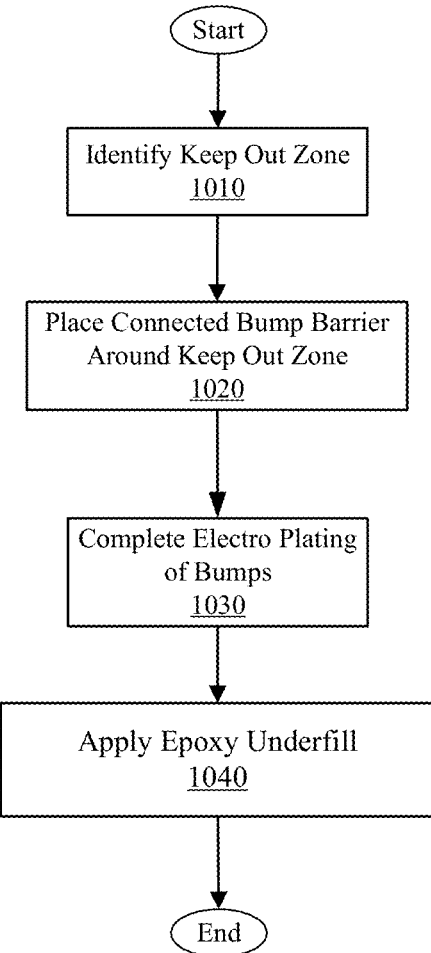
FIG. 10 illustrates an example fourth process flow.

FIG. 10 illustrates an example process flow 1000. In some examples, process flow 1000 shows a process flow to at least partially assemble die substrate 903 as shown in FIGS. 9A-B and described above.

Starting at block 1010, process flow 1000 identifies a keep out zone. In some examples, as mentioned above for FIG. 9A, keep out zone 901 of die substrate 903 may be identified as an area directly below an active silicon photonics component device.

Moving from block 1010 to block 1020, process flow 1000 includes placing a bump barrier around a keep out zone on a bottom side of a die substrate. In some examples, bump barrier 909 is placed around keep out zone 901 on a bottom side of die substrate 903. For these examples, the closeness of each bump included in bump barrier 909 takes into consideration a viscosity of an epoxy underfill to be used to protect bumps placed on the bottom side of die substrate 903.

Moving from block 1020 to block 1030, process flow 1000 includes completing the electro plating of bumps included in the die bumps and the bump barrier. In some examples, this includes completing the electro plating of bumps included in die bumps 904 and in bump barrier 909.

Moving from block 1030 to block 1040, process flow 1000 includes applying epoxy underfill 905 to a carrier substrate, after the die bumps have been reflowed and attached to the carrier substrate. Process flow 1000 may then come to an end.

Figure 11:
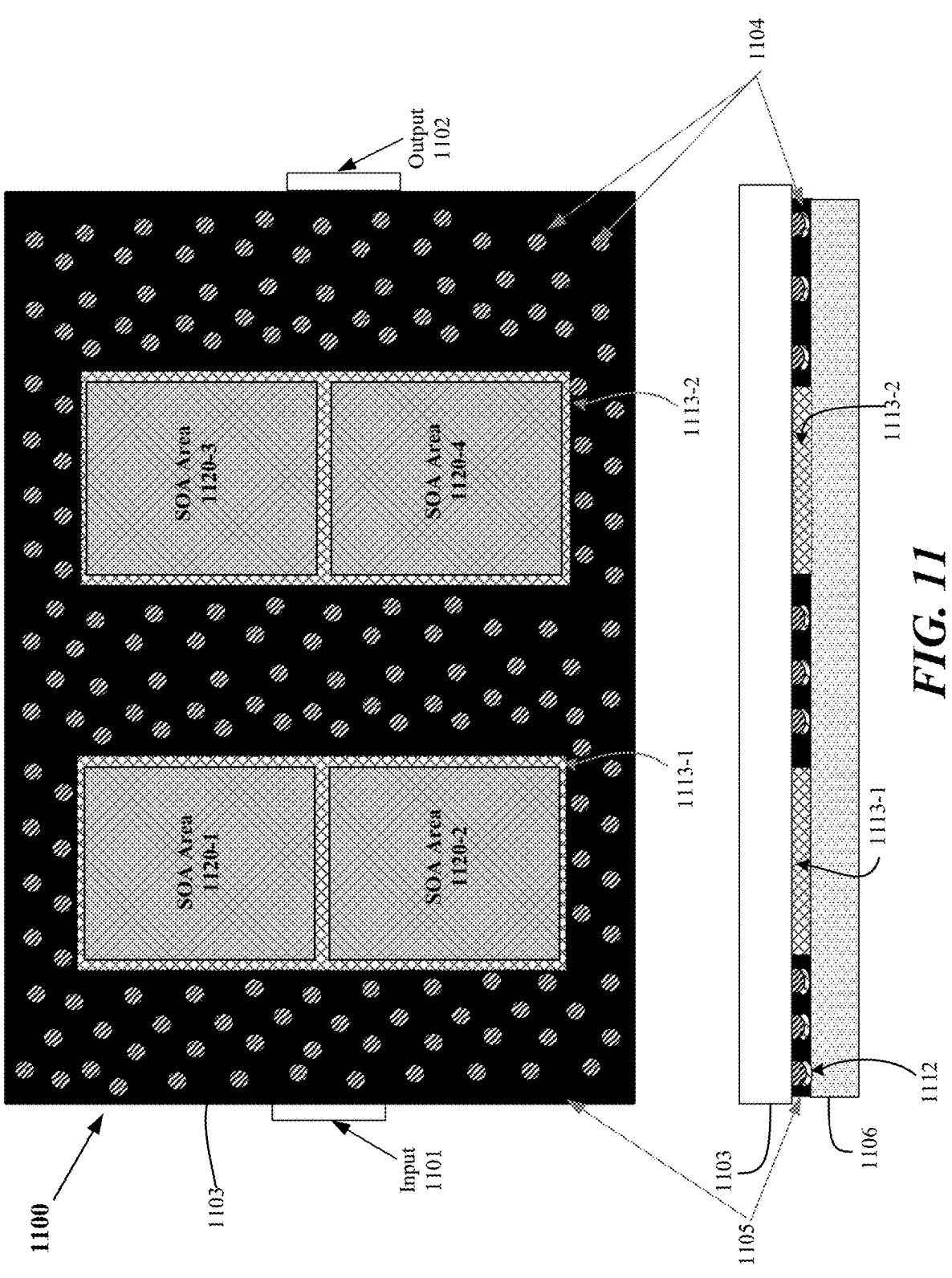
FIG. 11 illustrates a bottom and a cross-sectional view of a fifth example microelectronic assembly.

FIG. 11 illustrates a bottom and a cross-sectional view of a microelectronic assembly 1100. In some examples, as shown in FIG. 11, the bottom view of microelectronic assembly includes an input 1101 and an output 1102, die substrate 1103, bumps 1104 and SOA areas 1120-1 to 1120-4. For these examples, microelectronic assembly 1100 may be configured to serve as part of a LiDAR silicon photonics SoC and the shaded areas shown in FIG. 11 for SOA areas 1120-1 to 1120-4 may represent stress sensitive exclusion or keep out zones on a bottom or flip chip side of the LiDAR silicon photonics SoC.

According to some examples, low modulus film/thermal gap fillers 1113-1 and 1113-2 may be applied beneath respective SOA areas 1120-1/2 and 1120-3/4 prior to application of an epoxy underfill 1105 and subsequent flip chip attachment (e.g., coupling of die bumps 1104 with conductive lands 1112) to carrier substrate 1106. For these examples, low modulus film/thermal gap fillers 1113-1/2 may include a material having a sufficient amount of elasticity to reduce mechanical stresses to SOA area 1120-1 to 1120-4 and may also have an ability to absorb some thermal heat generated by respective SOAs above SOA areas 1120-1 to 1120-4. Also, low modulus film/thermal gap fillers 1113-1 and 1113-2 prevents or restricts epoxy underfill 1105 from flowing to SOA areas 1120-1 to 1120-4.

In some examples, application of low modulus film/thermal gap fillers 1113-1 and 1113-2 may be done after a dicing process to prevent material removal during a fluid/lubricant rinse during the dicing process. Another application method may be to directly dispense low modulus film/thermal gap fillers 1113-1 and 1113-2 directly onto SOA areas 1120-1 to 1120-4 prior to a thermal compression bonding or mass reflow process of die bumps 1304 to electrically couple die substrate 1103 to a carrier substrate 1106. Application of low modulus film/thermal gap fillers 1113-1 and 1113-2 may be done by dispersing low modulus film/thermal gap fillers 1113-1 and 1113-2 directly over SOA areas 1120-1 to 1120-4. A final thickness of low modulus film/thermal gap fillers 1113-1 and 1113-2 may be such that epoxy underfill 1105 is blocked from flowing to SOA areas 1120-1 to 1120-4 yet die bumps 1104 are able to couple with conductive lands 1112. Depending on a material used for low modulus film/thermal gap fillers 1113-1 and 1113-2, it may be possible to cure epoxy underfill 1105 at a same time as curing low modulus film/thermal gap fillers 1113-1 and 1113-2.

Figure 12:
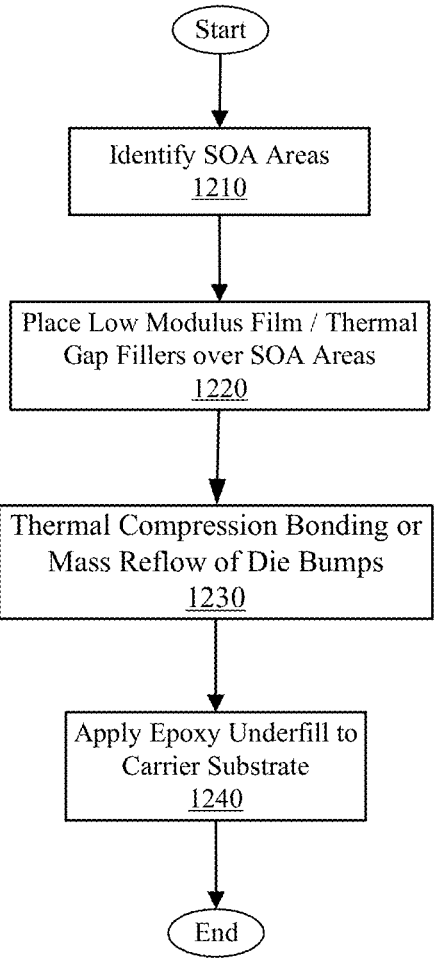
FIG. 12 illustrates an example fifth process flow.

FIG. 12 illustrates an example process flow 1200. In some examples, process flow 1200 shows a process flow to at least partially assemble microelectronic assembly 1100 as shown in FIG. 11.

Starting at block 1210, process flow 1200 identifies SOA areas on a bottom or flip chip side of a die substrate. According to some examples, SOA areas 1120-1 to 1120-4 on die substrate 1103 are identified.

Moving from block 1210 to block 1220, process flow 1200 places low modulus film/thermal gap fillers over the identified SOA areas. In some examples, low modulus film/thermal gap fillers 1113-1 and 1113-2 are placed over SOA areas 1120-1 to 1120-4.

Moving from block 1220 to block 1230, process flow 1200 applies a thermal compression bonding or mass reflow of the die bumps to electrically couple the die substrate to the carrier substrate. According to some examples, a thermal compression bonding or mass reflow of die bumps 1104 to electrically couple die substrate 1103 to carrier substrate 1106 is completed. Moving from block 1230 to block 1240, process flow 1200 applies epoxy underfill to the carrier substrate. According to some examples, epoxy underfill 1105 is applied to carrier substrate 1106. Process flow 1200 may then come to an end.

Figure 13:
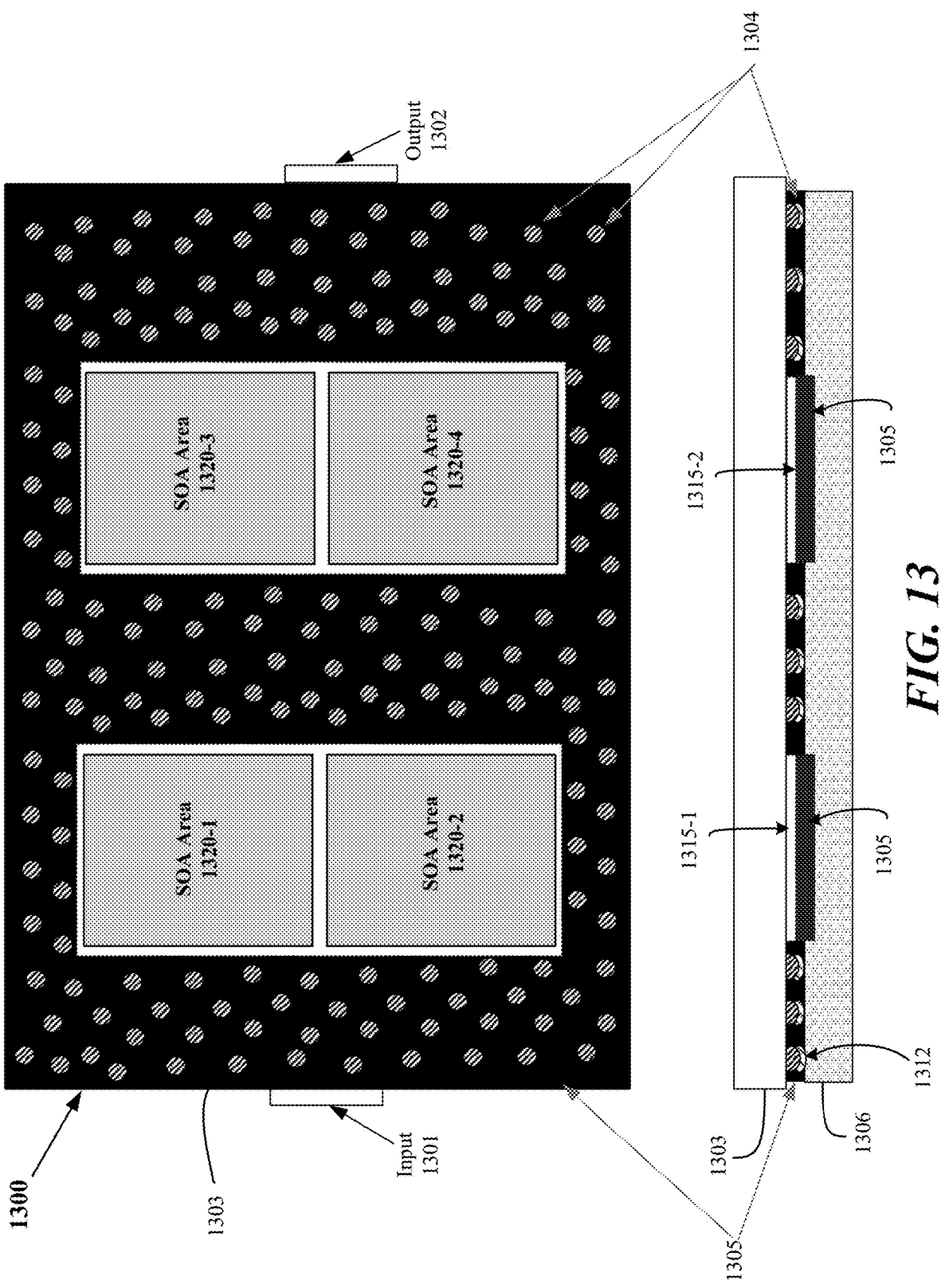
FIG. 13 illustrates a bottom and a cross-sectional view of a sixth example microelectronic assembly.

FIG. 13 illustrates a bottom and a cross-sectional view of a microelectronic assembly 1300. In some examples, as shown in FIG. 13, the bottom view of microelectronic assembly includes an input 1301 and an output 1302, a die substrate 1303, bumps 1304 and SOA areas 1320-1 to 1320-4. For these examples, microelectronic assembly 1300 may be configured to serve as part of a LiDAR silicon photonics SoC and the shaded areas shown in FIG. 13 for SOA areas 1320-1 to 1320-4 may represent stress sensitive exclusion or keep out zones on a bottom or flip chip side of the LiDAR silicon photonics SoC.

According to some examples, a substrate cavity 1315-1 for SOA areas 1320-1/2 and a substrate cavity 1315-2 for SOA areas 1320-3/4 may be etched into carrier substrate 1306. For these examples, cavity depth of substrate cavity 1315-1 and substrate cavity 1315-2 is based on a depth needed to keep epoxy underfill 1305 from filling substrate cavity 1315-1/2 to a level that comes in contact with any one of SOA areas 1320-1 to 1320-4 following a bonding of die substrate 1303 to carrier substrate 1306. As shown in FIG. 13, the white space around SOA areas 1320-1 to 1320-4 on the bottom side view of die substrate 103 and the white space (air gap) below die substrate 1303 for the cross-sectional view of microelectronic assembly 1300 indicate that the two substrate cavities each have an adequate depth to keep epoxy underfill 1305 from contacting SOA areas 1320-1 to 1320-4.

Figure 14:
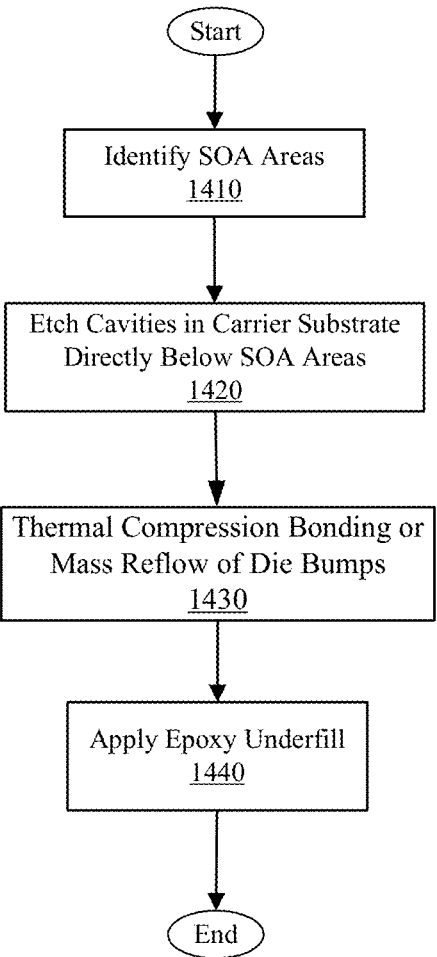
FIG. 14 illustrates an example sixth process flow.

FIG. 14 illustrates an example process flow 1400. In some examples, process flow 1400 shows a process flow to at least partially assemble microelectronic assembly 1300 as shown in FIG. 13.

Starting at block 1410, process flow 1400 identifies SOA areas on a bottom or flip chip side of a die substrate. According to some examples, SOA areas 1320-1 to 1320-4 on die substrate 1303 are identified.

Moving from block 1410 to block 1420, process flow 1400 etches cavities in a carrier substrate directly below the identified SOA areas. In some examples, substrate cavities 1315-1/2 are etched in carrier substrate 1306 that is to be directly below SOA areas 1320-1 to 1320-4, once the two substrates are thermally bonded. For these examples, a depth of substrate cavities 1315-1/2 is based on a depth to keep epoxy underfill 1305 from touching SOA areas 1320-1 to 1320-4 once the two substrates are electrically coupled thru the die bumps 1304.

Moving from block 1420 to block 1430, process flow 1400 applies a thermal compression bonding or mass reflow of the die bumps to electrically couple the die substrate to the carrier substrate. In some examples, a thermal compression bonding or mass reflow of die bumps 1304 to electrically couple die substrate 1303 to carrier substrate 1306 is applied. Moving from block 1430 to block 1440, process flow 1400 applies epoxy underfill to the carrier substrate.

According to some examples, epoxy underfill 1305 is applied to carrier substrate 1306. For these example, substrate cavities 1315-1/2 prevent epoxy underfill 1305 from touching SOA areas 1320-1 to 1320-4 following the thermo compression bonding or mass reflow of die bumps 1304 to electrically couple die substrate 1303 to carrier substrate 1306.

The set of process flows shown in FIGS. 4, 6, 8, 10, 12 and 14 may be representative of example methodologies for performing novel aspects described in this disclosure. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled" or "coupled with", however, may also mean that two or more elements are not in direct contact with each other, but yet still co-operate or interact with each other.

The following examples pertain to additional examples of technologies disclosed herein.

Example 1. An example microelectronic assembly may include a die substrate to include a component, the component to have an area on a flip chip side of the die substrate identified as an underfill exclusion zone. The microelectronic assembly may also include a plurality of die bumps on the flip chip side to enable the die substrate to electrically couple to a carrier substrate that is configured to route signals received through the plurality of die bumps. The microelectronic assembly may also include a film barrier deposited on the die substrate to cover at least a perimeter around the underfill exclusion zone such that an underfill material, when used to improve a solder joint reliability of the die bumps, is prevented from reaching to the underfill exclusion zone.

Example 2. The microelectronic assembly of example 1, the film barrier deposited on the die substrate may include a lithographic film deposited in one or more layers to reach a thickness that substantially matches a height of the plurality of die bumps.

Example 3. The microelectronic assembly of example 2, the lithographic film may be deposited over a surface that also covers the underfill exclusion zone. The lithographic film may be deposited over the surface such that an additional width of lithographic film deposited over the surface is sufficient to prevent the underfill material from flowing underneath the additional width of lithographic film and reaching the underfill exclusion zone.

Example 4. The microelectronic assembly of example 2, the lithographic film may be deposited as a wall along the perimeter around the underfill exclusion zone. The wall may have a width sufficient to prevent the underfill material from flowing underneath the wall and reaching the underfill exclusion zone.

Example 5. The microelectronics assembly of example 1, the component may be a silicon photonics component or may be a MEMS component.

Example 6. The microelectronic assembly of example 5, the silicon photonics component may be a semiconductor optical amplifier. For this example, the area on the flip chip side of the die substrate identified as the underfill exclusion zone may be where indium-phosphide bonding has occurred to enable the semiconductor optical amplifier.

Example 7. The microelectronic assembly of example 6, the plurality of die bumps on the flip chip side may couple the silicon photonics component with a carrier substrate to enable the silicon photonics component to electrically couple with a TIA.

Example 8. The microelectronic assembly of example 5, the microelectronic assembly may be included in a LIDAR silicon photonics system on a chip or a MEMS chip.

Example 9. The microelectronic assembly of example 1, the underfill material may be an epoxy underfill material.

Example 10. An example method for assembling at least a portion of a microelectronic assembly may include identifying an area on a flip chip side of a die substrate as an underfill exclusion zone for a component included in the die substrate. The method may also include depositing a film barrier on the die substrate to cover at least a perimeter around the underfill exclusion zone such that an underfill material, when used to improve a solder joint reliability of die bumps, is prevented from reaching the underfill exclusion zone.

Example 11. The method of example 10, depositing the film barrier on the die substrate may include depositing a lithographic film in one or more layers to reach a thickness that substantially matches a height of a plurality of die bumps on the flip chip side of the die substrate, the plurality of die bumps to enable the die substrate to electrically couple to carrier substrate.

Example 12. The method of example 11, depositing the lithographic film over a surface that may also cover the underfill exclusion zone. For this example, the lithographic film may be deposited over the surface such that an additional width of lithographic film deposited over the surface is sufficient to prevent the underfill material from flowing underneath the additional width of lithographic film and reaching the underfill exclusion zone.

Example 13. The method of example 11 may include depositing the lithographic film as a wall along the perimeter around the underfill exclusion zone. For this example, the wall to have a width sufficient to prevent the underfill material from flowing underneath the wall and reaching the underfill exclusion zone.

Example 14. The method of example 10, the component may be a silicon photonics component or may be a MEMS component.

Example 15. The method of example 14, the silicon photonics component may be a semiconductor optical amplifier. For this example, the area on the flip chip side of the die substrate identified as the underfill exclusion zone may be where indium-phosphide bonding has occurred to enable the semiconductor optical amplifier.

Example 16. The method of example 10, the underfill material may be an epoxy underfill material.

Example 17. An example microelectronic assembly may include a die substrate to include a component, the component to have an area on a flip chip side of the die substrate identified as an underfill exclusion zone. The microelectronic assembly may also include a plurality of die bumps on the flip chip side to enable the die substrate to electrically couple to a carrier substrate that is configured to route signals received through the plurality of die bumps. The microelectronic assembly may also include a bump barrier to include a plurality of bumps arranged around the underfill exclusion zone such that an underfill material, when used to improve a solder joint reliability of the plurality of die bumps, is prevented from reaching the underfill exclusion zone.

Example 18. The microelectronic assembly of example 17, the plurality of die bumps and the plurality of bumps may be arranged around the underfill exclusion zone are added to the die substrate via an electro plating process.

Example 19. The microelectronic assembly of example 17, the plurality of bumps may be arranged around the underfill exclusion zone as a perimeter wall of a single bump thickness. For this example, each bump in the perimeter wall may be arranged to contact bumps on either side to block the underfill material from flowing to the underfill exclusion zone.

Example 20. The microelectronic assembly of example 17, the plurality of bumps may be arranged around the underfill exclusion zone as a perimeter wall of a single bump thickness. For this example, each bump in the perimeter wall may be arranged to not contact bumps on either side, wherein a distance between each bump in the perimeter wall is close enough to prevent the underfill material from flowing far enough to reach the underfill exclusion zone.

Example 21. The microelectronic assembly of example 17, the component may be a silicon photonics component or a MEMS component.

Example 22. The microelectronic assembly of example 21, the silicon photonics component may be a semiconductor optical amplifier. For this example, the area on the flip chip side of the die substrate identified as the underfill exclusion zone is where indium-phosphide bonding has occurred to enable the semiconductor optical amplifier.

Example 23. The microelectronic assembly of example 22, the plurality of die bumps on the flip chip side may couple the silicon photonics component with a carrier substrate to enable the silicon photonics component to electrically couple with a TIA.

Example 24. The microelectronic assembly of example 17, the microelectronic assembly may be included in a LIDAR silicon photonics system on a chip or a MEMS chip.

Example 25. The microelectronic assembly of example 17, the underfill material may be an epoxy underfill material.

Example 26. An example microelectronic assembly may include a die substrate to include a component, the component to have an area on a flip chip side of the die substrate identified as an underfill exclusion zone. The microelectronic assembly may also include a plurality of die bumps on the flip chip side to enable the die substrate to electrically couple to a carrier substrate that is configured to route signals received through the plurality of die bumps. The microelectronic assembly may also include a low modulus film deposited on the die substrate to cover the underfill exclusion zone such that an underfill material, when used to improve a solder joint reliability of the plurality of die bumps, is prevented from flowing to the underfill exclusion zone.

Example 27. The microelectronic assembly of example 26, the low modulus film may be a material that is capable of being cured at a same time as the underfill material when applied to the carrier substrate.

Example 28. The microelectronic assembly of example 26, the low modulus film may be a material that is capable of absorbing at least some heat generated by the component while the component is operating.

Example 29. The microelectronic assembly of example 26, the component may be a silicon photonics component or a MEMS component.

Example 30. The microelectronic assembly of example 29, the plurality of die bumps on the flip chip side may couple the silicon photonics component with a carrier substrate to enable the silicon photonics component to electrically couple with a TIA.

Example 31. The microelectronic assembly of example 26, the microelectronic assembly may be included in a LIDAR silicon photonics system on a chip or a MEMS chip.

Example 32. The microelectronic assembly of example 26, the underfill material may be an epoxy underfill material.

Example 33. An example microelectronic assembly may include a die substrate to include a component, the component to have an area on a flip chip side of the die substrate identified as an underfill exclusion zone. The microelectronic assembly may also include a plurality of die bumps on the flip chip side to enable the die substrate to electrically couple to a carrier substrate that is configured to route signals received through the plurality of die bumps. The microelectronic assembly may also include a substrate cavity on the carrier substrate located below the underfill exclusion zone such that an underfill material, when used to improve a solder joint reliability of the plurality of die bumps, is prevented from contacting the underfill exclusion zone due to the underfill material flowing into the substrate cavity.

Example 34. The microelectronic assembly of example 33, the component may be a silicon photonics component or a MEMS component.

Example 35. The microelectronic assembly of example 34, the plurality of die bumps on the flip chip side may couple the silicon photonics component with a carrier substrate to enable the silicon photonics component to electrically couple with a TIA.

Example 36. The microelectronic assembly of example 34, the microelectronic assembly may be included in a LIDAR silicon photonics system on a chip or a MEMS chip.

Example 37. The microelectronic assembly of example 34, the underfill material may be an epoxy underfill material.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A microelectronic assembly comprising:
   a die substrate to include a component, the component to have an area on a flip chip side of the die substrate identified as an underfill exclusion zone;
   a plurality of die bumps on the flip chip side to enable the die substrate to electrically couple to a carrier substrate that is configured to route signals received through the plurality of die bumps; and
   a film barrier deposited on the die substrate to cover at least a perimeter around the underfill exclusion zone such that an underfill material, when used to improve a solder joint reliability of the die bumps, is prevented from reaching to the underfill exclusion zone, wherein the film barrier is deposited on the die substrate as a lithographic film deposited in one or more layers to reach a thickness that substantially matches a height of the plurality of die bumps, and wherein the lithographic film is to be deposited over a surface that also covers the underfill exclusion zone, the lithographic film to be deposited over the surface such that an additional width of lithographic film deposited over the surface is sufficient to prevent the underfill material from flowing underneath the additional width of lithographic film and reaching the underfill exclusion zone.

2. The microelectronic assembly of claim 1, the component comprises a silicon photonics component or a microelectromechanical system (MEMS) component.

3. The microelectronic assembly of claim 2, the silicon photonics component comprises a semiconductor optical amplifier.

4. The microelectronic assembly of claim 3, wherein the plurality of die bumps on the flip chip side couple the semiconductor optical amplifier with a carrier substrate to enable the semiconductor optical amplifier to electrically couple with a trans-impedance amplifier (TIA).

5. The microelectronic assembly of claim 2, wherein the microelectronic assembly is included in a light detection and ranging (LiDAR) silicon photonics system on a chip or a MEMS chip.

6. The microelectronic assembly of claim 1, the underfill material comprising an epoxy underfill material.

7. A method for assembling at least a portion of a microelectronic assembly, comprising:
   identifying an area on a flip chip side of a die substrate as an underfill exclusion zone for a component included in the die substrate; and
   depositing a film barrier on the die substrate to cover at least a perimeter around the underfill exclusion zone such that an underfill material, when used to improve a solder joint reliability of die bumps, is prevented from reaching the underfill exclusion zone, wherein the film barrier is deposited on the die substrate as a lithographic film in one or more layers to reach a thickness that substantially matches a height of a plurality of die bumps on the flip chip side of the die substrate that are arranged to enable the die substrate to electrically couple to a carrier substrate, and wherein the lithographic film is deposited over a surface that also covers the underfill exclusion zone, the lithographic film to be deposited over the surface such that an additional width of lithographic film deposited over the surface is sufficient to prevent the underfill material from flowing underneath the additional width of lithographic film and reaching the underfill exclusion zone.

8. The method of claim 7, the component comprises a silicon photonics component or a micro-electromechanical system (MEMS) component.

9. The method of claim 8, the silicon photonics component comprises a semiconductor optical amplifier.

10. The method of claim 7, the underfill material comprising an epoxy underfill material.

11. A microelectronic assembly comprising:
a die substrate to include a component, the component to have an area on a flip chip side of the die substrate identified as an underfill exclusion zone;
a plurality of die bumps on the flip chip side to enable the die substrate to electrically couple to a carrier substrate that is configured to route signals received through the plurality of die bumps; and
a bump barrier to include a plurality of bumps arranged around the underfill exclusion zone such that an underfill material, when used to improve a solder joint reliability of the plurality of die bumps, is prevented from reaching the underfill exclusion zone, wherein the plurality of bumps are arranged around the underfill exclusion zone as a perimeter wall of a single bump thickness, each bump in the perimeter wall arranged to not contact bumps on either side, wherein a distance between each bump in the perimeter wall is close enough to prevent the underfill material from flowing far enough to reach the underfill exclusion zone.

12. The microelectronic assembly of claim 11, the component comprises a silicon photonics component or a micro-electromechanical system (MEMS) component.

13. The microelectronic assembly of claim 12, the silicon photonics component comprises a semiconductor optical amplifier.

14. The microelectronic assembly of claim 11, the underfill material comprising an epoxy underfill material.

15. A microelectronic assembly comprising:
a die substrate to include a component, the component to have an area on a flip chip side of the die substrate identified as an underfill exclusion zone;
a plurality of die bumps on the flip chip side to enable the die substrate to electrically couple to a carrier substrate that is configured to route signals received through the plurality of die bumps; and
a low modulus film deposited on the die substrate to cover the underfill exclusion zone such that an underfill material, when used to improve a solder joint reliability of the plurality of die bumps, is prevented from flowing to the underfill exclusion zone.

16. The microelectronic assembly of claim 15, wherein the low modulus film comprises a material that is capable of being cured at a same time as the underfill material when applied to the carrier substrate.

17. The microelectronic assembly of claim 15, wherein the low modulus film comprises a material that is capable of absorbing at least some heat generated by the component while the component is operating.

18. The microelectronic assembly of claim 15, the component comprises a silicon photonics component or a microelectromechanical system (MEMS) component.

19. The microelectronic assembly of claim 15, the underfill material comprising an epoxy underfill material.

20. A microelectronic assembly comprising:
a die substrate to include a component, the component to have an area on a flip chip side of the die substrate identified as an underfill exclusion zone;
a plurality of die bumps on the flip chip side to enable the die substrate to electrically couple to a carrier substrate that is configured to route signals received through the plurality of die bumps; and
a substrate cavity on the carrier substrate located below the underfill exclusion zone such that an underfill material, when used to improve a solder joint reliability of the plurality of die bumps, is prevented from contacting the underfill exclusion zone due to the underfill material flowing into the substrate cavity.

21. The microelectronic assembly of claim 20, the component comprises a silicon photonics component or a microelectromechanical system (MEMS) component.

22. The microelectronic assembly of claim 20, the underfill material comprising an epoxy underfill material.

* * * * *